United States Patent
Fujiki et al.

(10) Patent No.: US 10,061,196 B2
(45) Date of Patent: Aug. 28, 2018

(54) PHOTOSENSITIVE COMPOSITION, METHOD FOR PRODUCING CURED FILM, CURED FILM, TOUCH PANEL, AND DISPLAY DEVICE

(71) Applicant: FUJIFILM CORPORATION, Minato-ku, Tokyo (JP)

(72) Inventors: Yuzo Fujiki, Shizuoka (JP); Shigekazu Suzuki, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 2 days.

(21) Appl. No.: 15/355,043

(22) Filed: Nov. 17, 2016

(65) Prior Publication Data

US 2017/0153544 A1 Jun. 1, 2017

(30) Foreign Application Priority Data

Nov. 30, 2015 (JP) ................................ 2015-233626

(51) Int. Cl.
| | | |
|---|---|---|
| G03F 7/033 | (2006.01) | |
| G03F 7/004 | (2006.01) | |
| G03F 7/031 | (2006.01) | |
| G03F 7/16 | (2006.01) | |
| G03F 7/20 | (2006.01) | |
| G03F 7/32 | (2006.01) | |

(52) U.S. Cl.
CPC ............ *G03F 7/033* (2013.01); *G03F 7/0045* (2013.01); *G03F 7/031* (2013.01); *G03F 7/16* (2013.01); *G03F 7/168* (2013.01); *G03F 7/2002* (2013.01); *G03F 7/322* (2013.01)

(58) Field of Classification Search
CPC ........................ G03F 7/033; G06F 2203/04103
USPC ............................................. 430/270.1–331
See application file for complete search history.

(56) References Cited

U.S. PATENT DOCUMENTS

| | | | | |
|---|---|---|---|---|
| 4,550,073 A * | 10/1985 | Neiss | ...................... | G03F 7/115 430/271.1 |
| 5,215,863 A * | 6/1993 | Nawata | .................. | C08F 283/10 430/280.1 |
| 7,462,671 B2 * | 12/2008 | Matsumoto | ............. | C08L 35/00 525/418 |
| 2014/0363767 A1* | 12/2014 | Murakami | ............. | C08G 18/00 430/270.1 |
| 2017/0022343 A1* | 1/2017 | Sakakibara | .............. | C08J 7/042 |

FOREIGN PATENT DOCUMENTS

| | | | |
|---|---|---|---|
| EP | 0365357 A2 | * | 10/1989 |
| JP | H1-161038 A | | 6/1989 |
| JP | H2-178659 A | | 7/1990 |
| JP | 2008-250189 A | | 10/2008 |
| JP | 2011-123331 A | | 6/2011 |
| JP | 2015-160869 A | | 9/2015 |

OTHER PUBLICATIONS

English translation of JP 2011-123331 a from machine translation from AIPN Japan Patent Office National center for Industrial Property Information and Training, generated Jun. 11, 2018, 48 pages.*
English translation of JP 2015-160869 a from machine translation from AIPN Japan Patent Office National center for Industrial Property Information and Training, generated Jun. 11, 2018, 32 pages.*
English translation of JP 2008-250189 a from machine translation from AIPN Japan Patent Office National center for Industrial Property Information and Training, generated May 29, 2018m 17 pages.*

* cited by examiner

*Primary Examiner* — Cynthia Hamilton
(74) *Attorney, Agent, or Firm* — SOLARIS Intellectual Property Group, PLLC

(57) ABSTRACT

A photosensitive composition, a method for producing a cured film using the photosensitive composition, a cured film prepared by curing the photosensitive composition, and a touch panel and a display device that use the cured film are provided. The photosensitive composition contains: a compound having two or more ethylenically unsaturated groups; a photopolymerization initiator; a polymer A1 containing a constitutional unit a1 represented by the following Formula 1 and a constitutional unit a2 having a carboxylic acid anhydride structure; particles; and a solvent. A molar content ratio of the constitutional unit a1 to the constitutional unit a2 in the polymer A1 is in a range of a1:a2=3:1 to 6:1. An acid anhydride value of the polymer A1 is from 1.30 to 3.00 mmol/g. A number average primary particle size of the particles is from 10 to 200 nm.

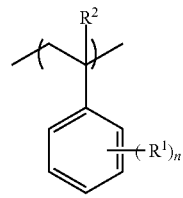

Formula 1

20 Claims, 3 Drawing Sheets

PHOTOSENSITIVE COMPOSITION, METHOD FOR PRODUCING CURED FILM, CURED FILM, TOUCH PANEL, AND DISPLAY DEVICE

CROSS-REFERENCE TO RELATED APPLICATION

The present application claims priority under 35 U.S.C. § 119 to Japanese Patent Application No. 2015-233626 filed on Nov. 30, 2015, the entire contents of which are incorporated herein by reference.

BACKGROUND

Technical Field

The present invention relates to a photosensitive composition, a method for producing a cured film, a cured film, a touch panel, and a display device.

Related Art

In an electronic part such as a thin film transistor (hereinafter, referred to as "TFT") type liquid crystal display element, a magnetic head element, an integrated circuit element, or a solid-state image sensing device, an interlayer insulating film is provided in order to insulate wirings generally disposed in layers. Since a material for forming the interlayer insulating film preferably reduces the number of processes for obtaining a pattern shape to be required, and has sufficient flatness, a photosensitive composition is widely used as the material.

For example, Japanese Patent Application Laid-Open (JP-A) No. 2015-160869 describes a curable resin composition containing an alkali soluble resin and a polyfunctional (meth)acrylate compound (bifunctional or more). The above alkali soluble resin is at least two or more of an alkali soluble resin (A) having an ethylenically unsaturated group in a side chain and an alkali soluble resin (B) having no ethylenically unsaturated group in a side chain. The above alkali soluble resin (B) is obtained by polymerizing a monomer component containing an aromatic vinyl compound, and a maleic acid anhydride derivative and/or a hydrolysate thereof.

JP-A No. 2011-123331 describes a coloring composition for color filters containing a copolymer (A) of a maleic acid anhydride with one or more ethylenically unsaturated monomers other than the maleic acid anhydride, a pigment, a binder resin (B), an active energy ray-polymerizable monomer, or a thermal polymerizable monomer.

JP-A No. 2008-250189 describes an alkali-developable photosensitive resin composition (Q) that contains a hydrophilic resin (A) containing a (meth)acryloyl group and a carboxyl group and prepared by modifying an epoxy resin, a vinyl resin (B), and a photoradical polymerization initiator (C). The content of an aromatic vinyl monomer (b1) in a monomer contained in the above vinyl resin (B) is from 45 to 100 wt %. The photosensitive resin composition is used for projection formation for vertical orientation type liquid crystal display device elements.

JP-A No. H2-178659 describes a multilayer image formable element including (i) a transparent support having a peeled surface, (ii) a single coloring photosensitive composition layer directly above the above peeled surface, and (iii) a thermosensitive adhesive layer directly above the above coloring photosensitive layer.

JP-A No. H1-161038 describes a resin composition that contains an epoxy resin (A) and/or an epoxy acrylate (B) prepared by reacting 1 chemical equivalent of an epoxy group of the epoxy resin with 0.1 to 1.0 chemical equivalent of acrylic acid, a copolymerization product (C) of styrene and maleic acid anhydride, an unsaturated group-containing compound (D) other than (B), and a photopolymerization initiator (E).

SUMMARY OF THE INVENTION

It is an object of an embodiment of the present invention to provide a photosensitive composition providing excellent perspiration resistance, pencil hardness, and transparency of a cured film to be obtained and suppressing the footing of the edge shape of the cured film, a method for producing a cured film using the above photosensitive composition, a cured film prepared by curing the above photosensitive composition, and a touch panel and a display device that use the above cured film.

The above problems have been solved by means described in the following item <1>, <10>, <11>, <13>, <15>, or <16>. The items <2> to <9>, <12>, and <14> that are preferable embodiments will be described later together.

<1> There is provided a photosensitive composition including: a compound having two or more ethylenically unsaturated groups; a photopolymerization initiator; a polymer A1 containing a constitutional unit a1 represented by the following Formula 1 and a constitutional unit a2 having a carboxylic acid anhydride structure; particles; and a solvent, wherein: a molar content ratio of the constitutional unit a1 to the constitutional unit a2, a1:a2, in the polymer A1 is in a range of from 3:1 to 6:1; an acid anhydride value of the polymer A1 is from 1.30 to 3.00 mmol/g; and a number average primary particle size of the particles is from 10 to 200 nm.

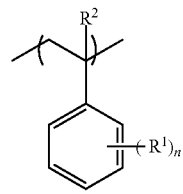

Formula 1

In the Formula 1, each $R^1$ independently represents a hydroxyl group, an alkyl group, an aryl group, an alkoxy group, a carboxy group, or a halogen atom; $R^2$ represents a hydrogen atom, an alkyl group, or an aryl group; and n represents an integer from 0 to 5.

<2> In the photosensitive composition according to item <1>, a content of the polymer A1 is from 0.5 to 8 mass % based on a total solid content of the photosensitive composition.

<3> In the photosensitive composition according to item <1> or <2>, a content of the particles is from 10 to 40 mass % based on a total solid content of the photosensitive composition.

<4> In the photosensitive composition according to any one of items <1> to <3>, a content of the compound having two or more ethylenically unsaturated groups is from 30 to 70 mass % based on a total solid content of the photosensitive composition.

<5> The photosensitive composition according to any one of items <1> to <4> further includes a polymerization inhibitor.

<6> In the photosensitive composition according to any one of items <1> to <5>, an acid value of the photosensitive composition based on a total solid content is 100 mgKOH/g or less.

<7> In the photosensitive composition according to any one of items <1> to <6>, the constitutional unit a2 is a constitutional unit containing a five-member cyclic carboxylic acid anhydride structure.
<8> In the photosensitive composition according to any one of items <1> to <7>, the constitutional unit a2 contains a constitutional unit represented by the following Formula a2-1 and/or a constitutional unit represented by the following Formula a2-2.

Formula a2-1

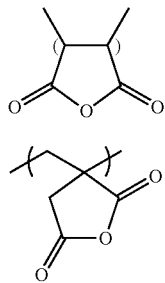

Formula a2-2

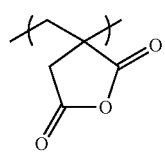

<9> In the photosensitive composition according to any one of items <1> to <8>, the constitutional unit a2 contains a constitutional unit represented by the following Formula a2-1.

Formula a2-1

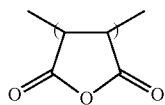

<10> There is provided a method for producing a cured film, including, in the following order:
applying the photosensitive composition according to any one of items <1> to <9> on a substrate;
removing a solvent from the applied photosensitive composition;
exposing at least a part of the photosensitive composition from which the solvent is removed to actinic radiation; and
subjecting the photosensitive composition to a heat treatment.
<11> There is provided a method for producing a cured film, including, in the following order:
applying the photosensitive composition according to any one of items <1> to <9> on a substrate;
removing a solvent from the applied photosensitive composition;
exposing at least a part of the photosensitive composition from which the solvent is removed to actinic radiation;
developing the exposed photosensitive composition by an aqueous developing solution; and
subjecting the developed photosensitive composition to a heat treatment.
<12> In the method for producing a cured film according to item <11>, a temperature in the heat treatment is from 80 to 150° C.
<13> There is provided a cured film prepared by curing the photosensitive composition according to any one of items <1> to <9>.
<14> The cured film according to item <13> is an interlayer insulating film or an overcoat film.

<15> There is provided a touch panel including the cured film according to item <13> or <14>.
<16> There is provided a display device including the cured film according to item <13> or <14>.

The embodiment of the present invention can provide a photosensitive composition providing excellent perspiration resistance, pencil hardness, and transparency of a cured film to be obtained and suppressing the footing of the edge shape of the cured film, a method for producing a cured film using the above photosensitive composition, a cured film prepared by curing the above photosensitive composition, and a touch panel and a display device that use the above cured film.

DETAILED DESCRIPTION OF THE INVENTION

Figure 1:
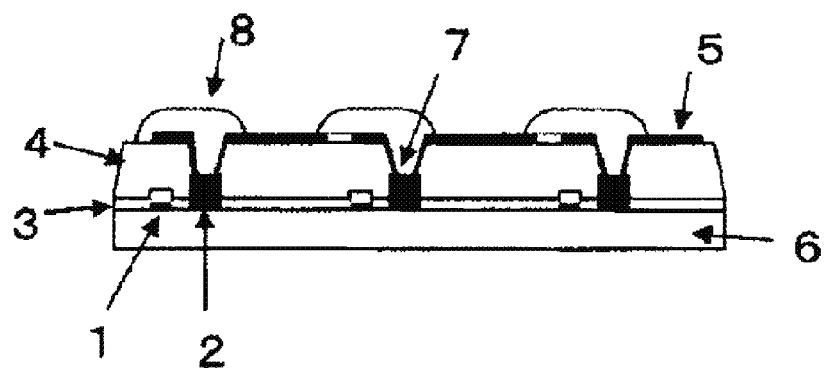
FIG. 1 is a schematic diagram of the constitution of one example of an organic EL (Electroluminescence) display device, showing a schematic sectional view of a substrate in a bottom emission type organic EL display device, the substrate having a planarization film 4.

The content of the present disclosure will be described in detail below. The description of the composition features given below is based on representative embodiments of the present disclosure, but the present disclosure should not be construed as being limited to such embodiments. In the present specification, "to" is used to mean that the numerical values given before and after it are included as a lower limit value and an upper limit value.
A "constitutional unit a1 represented by the following Formula 1" or the like is merely referred to as a "constitutional unit a1" or the like.
With regard to the notation of a group (atomic group) in the present specification, a notation that does not indicate whether it is substituted or unsubstituted includes one without a substituent as well as one with a substituent. For example, an "alkyl group" includes an alkyl group without a substituent (unsubstituted alkyl group) as well as an alkyl group with a substituent (substituted alkyl group).
A chemical structural Formula in the present specification may be described using a simplified structural Formula in which hydrogen atoms are omitted.
In the present specification, "(meth)acrylate" represents acrylate and methacrylate; "(meth)acrylic" represents acrylic and methacrylic; and "(meth)acryloyl" represents acryloyl and methacryloyl.
In the present disclosure, a "polymerizable monomer" or the like is merely referred to as a "component A" or the like.
In the present disclosure, "mass %" and "wt %" have the same meaning, and "parts by mass" and "parts by weight" have the same meaning.
In the present disclosure, any combination of two or more preferable aspects is a more preferable aspect.

In the present disclosure, a weight average molecular weight and a number average molecular weight in a polymer component are (polystyrene converted) measured by gel permeation chromatography (GPC) when tetrahydrofuran (THF) is used as a solvent.

(Photosensitive Composition)

A photosensitive composition of the present disclosure (hereinafter, merely referred to as a "composition") contains a compound having two or more ethylenically unsaturated groups, a photopolymerization initiator, and a polymer A1 containing a constitutional unit a1 represented by the following Formula 1 and a constitutional unit a2 having a carboxylic acid anhydride structure, particles, and a solvent. A molar content ratio of the constitutional unit a1 to the constitutional unit a2 in the above polymer A1 is in a range of a1:a2=3:1 to 6:1. An acid anhydride value of the above polymer A1 (that is, the valence of acid anhydride contained in the polymer A1) is from 1.30 to 3.00 mmol/g. A number average primary particle size of the above particles is from 10 to 200 nm.

The photosensitive composition of the present disclosure is preferably a negative photosensitive composition.

The photosensitive composition of the present disclosure can be preferably patterned by photolithography using an aqueous developing solution. When the photosensitive composition of the present disclosure is patterned by photolithography using the aqueous developing solution, a pattern to be formed is a negative pattern in which a photosensitive part remains as a pattern.

In the present disclosure, a "solid content" in the photosensitive composition means a component excluding a volatile component such as a solvent.

A reduction in resistance of wiring included in a sensor substrate of a capacitance type touch panel has been required with growing in size and power saving of a touch panel display device. Specifically, the use and consideration of low-resistive metals (silver, copper, molybdenum, titanium, and aluminum or the like, and laminated bodies and alloys thereof or the like) have been advanced.

However, the present inventors found that the wiring is discolored and corroded by long-term use when a usual cured film is used as a protective film of a touch panel using the above metal electrode, which may disadvantageously cause an increase in a resistance value and disconnection of metal wiring. The above discoloration of the wiring is presumed to be caused by the following. User's sweat and salt contents in the sweat are brought into contact with the wiring via the protective film, which causes the corrosion of the wiring to cause the discoloration of the wiring. In the present disclosure, the suppression of the corrosion of the wiring is referred to as perspiration resistance.

As a result of intensive studies, the present inventors found that a photosensitive composition is obtained, which provides excellent perspiration resistance and pencil hardness of a cured film to be obtained and suppresses the footing of the edge shape of the cured film. The photosensitive composition contains: a compound having two or more ethylenically unsaturated groups; a photopolymerization initiator; a polymer A1 containing a constitutional unit a1 represented by the following Formula 1 and a constitutional unit a2 having a carboxylic acid anhydride structure; particles; and a solvent. A molar content ratio of the constitutional unit a1 to the constitutional unit a2 in the above polymer A1 is in a range of a1:a2=3:1 to 6:1. An acid anhydride value of the above polymer A1 is from 1.30 to 3.00 mmol/g. A number average primary particle size of the above particles is from 10 to 200 nm.

The detailed mechanism is unknown, but the concerted actions of the above components are presumed to provide the above effect.

The footing of the edge shape of the cured film (hereinafter, merely also referred to as "footing") means a problem that a footing distance is long and the discrimination of an image/non-image part is less likely to be formed although the shape of the edge of the cured film is a forward tapered shape after the composition is cured. "The discrimination is less likely to be formed" means that a difference between the solubility of an unexposed part (non-image part) to a developing solution and the dissolving resistance of an exposed part (image part) to the developing solution is small, which is less likely distinguish between the image part and the non-image part after developing.

Hereinafter, the components contained in the photosensitive composition of the present disclosure will be described.

<Compound Having Two or More Ethylenically Unsaturated Groups>

The photosensitive composition of the present disclosure contains a compound having two or more ethylenically unsaturated groups.

The above compound having two or more ethylenically unsaturated groups is preferably a compound having no acid anhydride structure.

The photosensitive composition of the present disclosure may contain a compound having only one ethylenically unsaturated group, and a ratio of the compound having two or more ethylenically unsaturated groups based on the total mass of the compounds having one or more ethylenically unsaturated groups is preferably 50 mass % or more, more preferably 80 mass % or more, still more preferably 90 mass % or more, and particularly preferably 95 mass % or more.

The molecular weight of the compound having two or more ethylenically unsaturated groups used in the present disclosure (the weight average molecular weight when the compound has a molecular weight distribution) is from 100 to 100,000, preferably from 200 to 50,000, and more preferably from 300 to 30,000 from the viewpoint of the hardness of the cured film.

The compound having two or more ethylenically unsaturated groups is not limited to a monomer, and may have a chemical form such as a prepolymer, i.e., a dimer, a trimer, an oligomer, a polymer, or a mixture and copolymer thereof.

The number of the ethylenically unsaturated groups in the above compound having two or more ethylenically unsaturated groups is not particularly limited, and is preferably from 2 to 20, more preferably from 3 to 16, and still more preferably from 4 to 10 when the compound has a molecular weight of 3,000 or less.

The above compound having two or more ethylenically unsaturated groups can be selected if appropriate according to the object without particular limitation. Examples thereof include an ester compound, an amide compound, an urethane compound, and the other compound.

Examples of the above ester compound include a (meth)acrylic ester, an itaconic ester, a crotonic ester, an isocrotonic ester, a maleic ester, and the other ester compound. Among these, a polyfunctional (meth)acrylic ester (polyfunctional (meth)acrylate compound) or the like is preferable.

Examples of the above polyfunctional (meth)acrylate compound include polyethylene glycol di(meth)acrylate, ethylene glycol di(meth)acrylate, triethylene glycol di(meth)acrylate, 1,3-butanediol di(meth)acrylate, tetramethylene glycol di(meth)acrylate, hexanediol di(meth)acrylate, 1,9-nonanediol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, sorbitol tri(meth)acrylate, sorbitol tetra(meth)acrylate, trimethylolethane tri(meth)acrylate, and neopentyl glycol di(meth)acrylate. Among these, trimethylolpropane triacrylate, pentaerythritol tetra(meth)acrylate, and/or dipentaerythritol hexa(meth)acrylate are particularly preferable.

Another examples of the above polyfunctional (meth) acrylate compound include one prepared by adding ethylene oxide or propylene oxide to a polyfunctional alcohol such as glycerol, trimethylolethane, or bisphenol A, and converting the resulting adduct into a (meth)acrylate; urethane acrylates described in Japanese Patent Publication (JP-B) Nos. S48-41708, and S50-6034, and JP-A No. S51-37193; polyester acrylates described in JP-A No. S48-64183, JP-B Nos. S49-43191 and S52-30490; an epoxy acrylate as a reaction product between an epoxy resin and (meth)acrylic acid; and a (meth)acrylate, an urethane (meth)acrylate, and a vinyl ester described in JP-A No. S60-258539.

Another examples of the polyfunctional ethylenically unsaturated compound include trimethylolpropane tri(acryloyloxypropyl)ether, tri(acryloyloxyethyl)isocyanurate, and photocurable monomers and oligomers described in Journal of the Adhesion Society of Japan, Vol. 20, No. 7, p. 300-308.

Examples of the above amide compound include an amide (monomer) between an unsaturated carboxylic acid and an aliphatic polyamine compound. Specific examples thereof include methylenebis(meth)acrylamide, 1,6-hexamethylenebis(meth)acrylamide, diethylenetriamine tris(meth)acrylamide, and xylylenebis(meth)acrylamide. Another examples thereof include (meth)acrylamide described in JP-A No. S60-258539.

Examples of the above urethane compound include an urethane linkage polymerizable compound manufactured using the addition reaction of isocyanate and a hydroxyl group. Examples thereof include an urethanated product of pentaerythritol triacrylate and hexamethylene diisocyanate, an urethanated product of pentaerythritol triacrylate and toluene diisocyanate, an urethanated product of pentaerythritol triacrylate and isophorone diisocyanate, an urethanated product of dipentaerythritol pentaacrylate and hexamethylene diisocyanate, an urethanated product of dipentaerythritol pentaacrylate and toluene diisocyanate, and an urethanated product of dipentaerythritol pentaacrylate and isophorone diisocyanate.

Specific examples thereof include urethane acrylates described in JP-A Nos. 2011-126921 and S51-37193, and JP-B Nos. H2-32293 and H2-16765, and these descriptions are incorporated in the present specification.

Another examples of the polyfunctional ethylenically unsaturated compound include allyl compounds and alkenyl group-containing compounds described in JP-A No. S60-258539 and International Patent Laid-open No. 2010/050580.

Specifically, 1,2-divinylbenzene, 1,4-divinylbenzene, 1,2-diarylbenzene, 1,3-diarylbenzene, 1,4-diarylbenzene, 1,3,5-trivinylbenzene, 1,3,5-triarylbenzene, 1,2,4,5-tetraarylbenzene, hexaarylbenzene, divinyltoluene, bisphenol A diaryl ether, 1,2-diaryl oxybenzene, 1,4-diaryl oxybenzene, diaryl terephthalate, diaryl isophthalate, 1,4-bis(dimethlvinylsilyl) benzene, divinylmethylphenylsilane, divinyldiphenylsilane, and diaryldiphenylsilane.

From the viewpoint of reducing the acid value of the photosensitive composition to be described later, the above compound having two or more ethylenically unsaturated groups contains a compound having an acid value of preferably from 0 to 300, and more preferably from 0 to 200. The acid value of the above compound having two or more ethylenically unsaturated groups can be measured in accordance with the method described in JIS K2501 (2003).

As the above compound having two or more ethylenically unsaturated groups, various resins having two or more ethylenically unsaturated groups can also be used. Among these, an acrylic resin having two or more ethylenically unsaturated groups is preferable, and an acrylic resin having a constitutional unit having an ethylenically unsaturated group is more preferable.

The photosensitive composition of the present disclosure may contain the compounds having two or more ethylenically unsaturated groups singly or two or more kinds thereof.

The content of the compound having two or more ethylenically unsaturated groups in the photosensitive composition of the present disclosure is preferably from 20 to 85 mass %, more preferably from 30 to 70 mass %, and particularly preferably from 40 to 65 mass %, based on the total solid content of the photosensitive composition. The above range provides excellent adhesion of a cured product to be obtained, and excellent hardness and transparency of the cured product to be obtained.

In the present disclosure, as the compound having two or more ethylenically unsaturated groups, commercial products may be used. Examples of polybasic modified acryl oligomers manufactured by TOAGOSEI, CO., LTD. include ARONIX (registered trademark) series M-510 and M-520, TO-2349, and TO-2359. Examples of the commercial product of the urethane compound include U-6HA, UA-1100H, U-6LPA, U-15HA, U-6H, U-10HA, U-10PA, UA-53H, and UA-33H (all are registered trademarks) available from Shin-Nakamura Chemical Co., Ltd., UA-306H, UA-306T, UA-306I, and UA-510H available from KYOEISHA CHEMICAL Co., Ltd., Laromer UA-9048, UA-9050, and PR9052 available from BASF, and EBECRYL 220, 5129, and 8301, KRM8200, 8200AE, and 8452 available from DAICEL-ALLNEX LTD.

<Photopolymerization Initiator>

The photosensitive composition of the present disclosure contains a photopolymerization initiator.

The photosensitive composition preferably contains a photoradical polymerization initiator as the photopolymerization initiator.

The photoradical polymerization initiator that can be used in the present disclosure is a compound that can start and promote the polymerization of an ethylenically unsaturated compound or the like by light.

The "light" is not particularly limited as long as it is actinic radiation that can apply energy that can generate an initiating species from a photopolymerization initiator upon irradiation therewith, and widely includes α-rays, γ-rays, X rays, ultraviolet (UV), visible light, or an electron beam. Among these, light containing at least UV is preferable.

Examples of the photopolymerization initiator include an oxime ester compound, an organic halide compound, an oxydiazole compound, a carbonyl compound, a ketal compound, a benzoin compound, an acridine compound, an organic peroxide compound, an azo compound, a coumarin compound, an azide compound, a metallocene compound, a hexaarylbiimidazole compound, an organoboric acid compound, a disulfonic acid compound, an onium salt compound, and an acylphosphine oxide compound. Among these, from the viewpoint of sensitivity, the oxime ester compound or the hexaarylbiimidazole compound is preferable, and the oxime ester compound is more preferable.

As the oxime ester compound, compounds described in JP-A Nos. 2000-80068 and 2001-233842, Japanese National-Phase Publication (JP-A) No. 2004-534797, and JP-A Nos. 2007-231000 and 2009-134289 may be used.

The oxime ester compound is preferably a compound represented by the following Formula b-1 or Formula b-2.

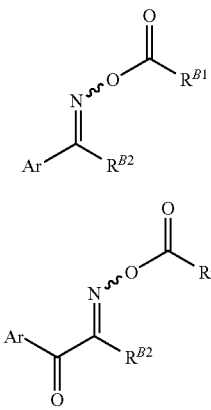

(b-1)

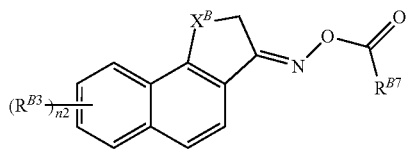

(b-4)

(b-2)

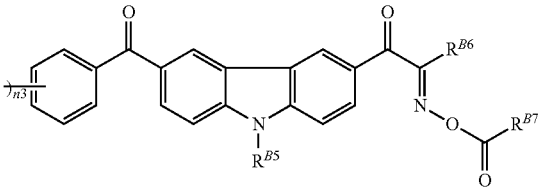

(b-5)

In the Formula b-1 or the Formula b-2, Ar represents an aromatic group or a hetero aromatic group; $R^{B1}$ represents an alkyl group, an aromatic group, or an alkyloxy group; $R^{B2}$ represents a hydrogen atom or an alkyl group, and $R^{B2}$ may be bonded to an Ar group to form a ring.

In the Formula b-1 or the Formula b-2, Ar represents an aromatic group or a hetero aromatic group, preferably a group excluding one hydrogen atom from a benzene ring compound, a naphthalene ring compound, or a carbazole ring compound, and more preferably a naphthalene group that is bonded to $R^{B2}$ to form a ring, or a carbazole group that is bonded to $R^{B2}$ to form a ring. Preferable examples of a hetero atom in the hetero aromatic group include a nitrogen atom, an oxygen atom, and a sulfur atom.

$R^{B1}$ represents an alkyl group, an aromatic group, or an alkoxy group, and is preferably a methyl group, an ethyl group, a benzyl group, a phenyl group, a naphthyl group, a methoxy group, or an ethoxy group, and more preferably the methyl group, the ethyl group, the phenyl group, or the methoxy group.

$R^{B2}$ represents a hydrogen atom or an alkyl group, and is preferably a hydrogen atom or a substituted alkyl group, and more preferably a hydrogen atom, a substituted alkyl group that is bonded to Ar to form a ring, or a toluene thioalkyl group that is bonded to Ar to form a ring.

Ar is preferably a group having from 4 to 20 carbon atoms; $R^{B1}$ is preferably a group having from 1 to 30 carbon atoms; and $R^{B2}$ is preferably a group having from 1 to 50 carbon atoms.

The oxime ester compound is more preferably a compound represented by the following Formula b-3, Formula b-4, or Formula b-5.

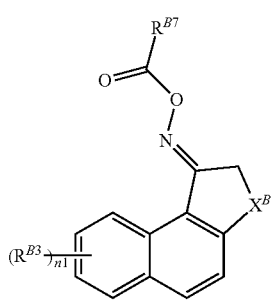

(b-3)

In the Formula b-3 to the Formula b-5, $R^{B7}$ represents an alkyl group, an aromatic group, or an alkoxy group; $X^B$ represents $-CH_2-$, $-C_2H_4-$, $-O-$, or $-S-$; $R^{B3}$ each independently represent a halogen atom; $R^{B4}$ each respectively represent an alkyl group, a phenyl group, an alkyl-substituted amino group, an arylthio group, an alkylthio group, an alkoxy group, an aryloxy group, or a halogen atom; $R^{B5}$ represents a hydrogen atom, an alkyl group, or an aryl group; $R^{B6}$ represents an alkyl group; n1 and n2 each independently represent an integer from 0 to 6; and n3 represents an integer from 0 to 5.

$R^{B7}$ is preferably a group represented by $R^{B11}$—X'-alkylene group-($R^{B11}$ represents an alkyl group or an aryl group, and X' represents a sulfur atom or an oxygen atom). $R^{B11}$ is preferably an aryl group, and more preferably a phenyl group. The alkyl group and aryl group as $R^{B11}$ may be substituted with a halogen atom (preferably, a fluorine atom, a chlorine atom, or a bromine atom) or an alkyl group.

$X^B$ is preferably a sulfur atom.

$R^{B3}$ and $R^{B4}$ may be bonded at an optional position on an aromatic ring.

$R^{B4}$ is preferably an alkyl group, a phenyl group, an arylthio group, or a halogen atom, more preferably an alkyl group, an arylthio group, or a halogen atom, and still more preferably an alkyl group or a halogen atom. The alkyl group in $R^{B4}$ is preferably an alkyl group having from 1 to 5 carbon atoms, and more preferably a methyl group or an ethyl group. The halogen atom is preferably a chlorine atom, a bromine atom, or a fluorine atom.

$R^{B4}$ has preferably from 0 to 50 carbon atoms, and more preferably from 0 to 20 carbon atoms.

$R^{B5}$ is preferably an alkyl group. The alkyl group in $R^{B5}$ is preferably an alkyl group having from 1 to 5 carbon atoms, and more preferably a methyl group or an ethyl group. The aryl group in $R^{B5}$ is preferably an aryl group having from 6 to 10 carbon atoms.

$R^{B6}$ is preferably an alkyl group having from 1 to 5 carbon atoms, and more preferably a methyl group or an ethyl group.

n1 and n2 each represent the number of substitution of $R^{B3}$ on an aromatic ring in the Formula b-3 or the Formula b-4, and n3 represents the number of substitution of $R^{B4}$ on an aromatic ring in the Formula b-5.

n1 to n3 are each independently an integer, preferably from 0 to 2, and more preferably from 0 or 1.

Hereinafter, the oxime ester compounds preferably used in the present disclosure are exemplified. However, needless to say, the oxime ester compound used in the present disclosure is not limited thereto. Me represents a methyl group, and Ph represents a phenyl group. The cis-trans isomerism of the double bond of oxime in these compounds may be any one of E and Z or a mixture of E and Z.

PI-1
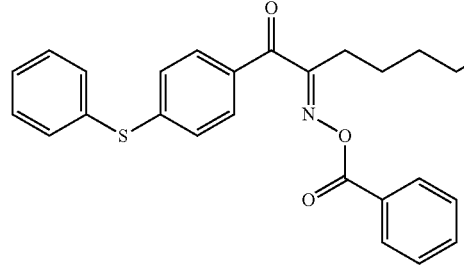

PI-2
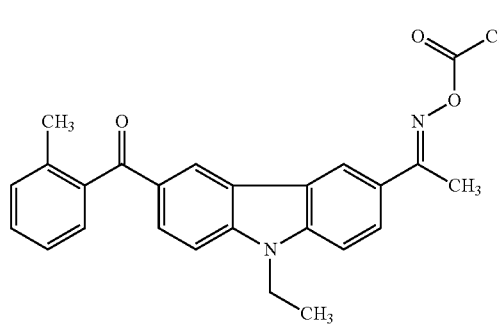

PI-3
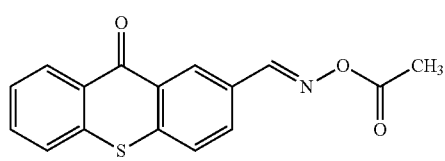

PI-4
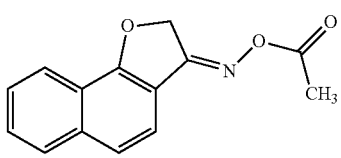

PI-5
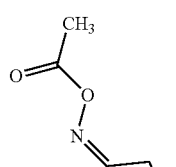

PI-6
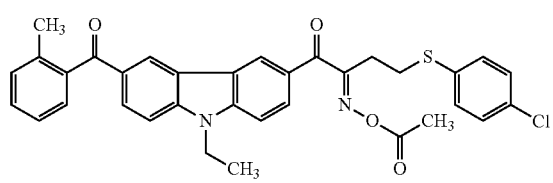

PI-7
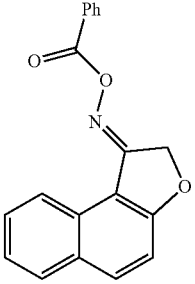

PI-8
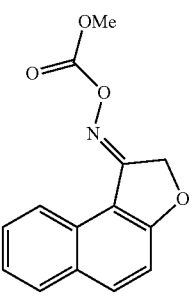

PI-9
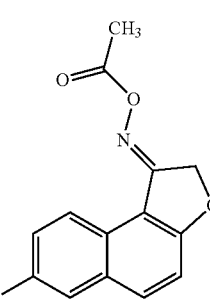

PI-10
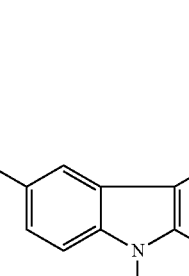

Specific examples of the organic halide compound include compounds described in Wakabayashi et al., "Bull Chem. Soc. Japan", 42, 2924 (1969), U.S. Pat. No. 3,905,815, JP-B No. S46-4605, JP-A Nos. S48-36281, S55-32070, S60-239736, S61-169835, S61-169837, S62-58241, S62-212401, S63-70243, and S63-298339, and M. P. Hutt, et al., "Journal of Heterocyclic Chemistry", Vol. 7, 511 (1970), or the like. Particularly, examples thereof include an oxazole compound substituted with a trihalomethyl group and an s-triazine compound.

Examples of the hexaaryl biimidazole compound include various compounds described in JP-B No. H6-29285, U.S. Pat. Nos. 3,479,185, 4,311,783, and 4,622,286, or the like.

Examples of the acylphosphine oxide compound include a monoacylphosphine oxide compound and a bisacylphosphine oxide compound, and specific examples thereof include Irgacure 819, Darocur 4265, and Darocur TPO manufactured by BASF.

With regard to the photopolymerization initiator, one kind may be used or two or more kinds may be used in combination.

The total amount of the photopolymerization initiator in the photosensitive composition of the present disclosure is preferably from 0.05 to 30 parts by mass, more preferably from 0.1 to 20 parts by mass, still more preferably from 0.1 to 10 parts by mass, and particularly preferably from 0.1 to 5 parts by mass, based on 100 parts by mass of the total solid content in the photosensitive composition.

<Polymer A1 Containing Constitutional Unit a1 Represented by Formula 1 and Constitutional Unit a2 Having Carboxylic Acid Anhydride Structure>

The photosensitive composition of the present disclosure contains a polymer A1 (hereinafter, also merely referred to as a "polymer A1") containing a constitutional unit a1 represented by the Formula 1 and a constitutional unit a2 having a carboxylic acid anhydride structure.

The weight average molecular weight of the polymer A1 is preferably from 1,000 to 500,000, more preferably from 3,000 to 300,000, and still more preferably from 5,000 to 200,000.

The polymer A1 preferably has no ethylenically unsaturated group.

The above polymer A1 has an acid value of preferably from 0 to 300, and more preferably from 0 to 100. The acid value of the polymer A1 can be measured in accordance with the method described in JIS K2501 (2003).

[Constitutional Unit a1]

The constitutional unit a1 is a constitutional unit represented by the following Formula 1.

The constitutional unit a1 represented by the Formula 1 is preferably a constitutional unit derived from a styrene compound.

Examples of the styrene compound include styrene, p-methyl styrene, α-methyl styrene, α,p-dimethlstyrene, p-ethyl styrene, p-t-butyl styrene, and 1,1-diphenyl ethylene. Styrene or α-methylstyrene is preferable, and styrene is more preferable. The styrene compounds may be used singly, or in combination of two or more kinds thereof.

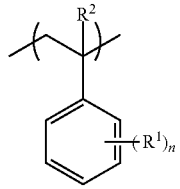

Formula 1

In the Formula 1, each $R^1$ independently represents a hydroxyl group, an alkyl group, an aryl group, an alkoxy group, a carboxy group, or a halogen atom; $R^2$ represents a hydrogen atom, an alkyl group, or an aryl group; and n represents an integer from 0 to 5.

$R^1$ each independently represent, preferably an alkyl group having from 1 to 10 carbon atoms, an aryl group having from 6 to 12 carbon atoms, an alkoxy group having from 1 to 10 carbon atoms, a carboxy group, an F atom, a Cl atom, a Br atom, or an I atom, and more preferably an alkyl group having from 1 to 4 carbon atoms, a phenyl group, an alkoxy group having from 1 to 4 carbon atoms, a Cl atom, or a Br atom.

$R^2$ is preferably a hydrogen atom, an alkyl group having from 1 to 10 carbon atoms, or an aryl group having from 6 to 12 carbon atoms, more preferably a hydrogen atom or an alkyl group having from 1 to 4 carbon atoms, still more preferably a hydrogen atom, a methyl group, or an ethyl group, and particularly preferably a hydrogen atom.

n is an integer, preferably from 0 to 3, more preferably 0 or 1, and still more preferably 0.

The content of the constitutional unit a1 in the polymer A1 is preferably from 20 to 90 mass %, more preferably from 30 to 90 mass %, and still more preferably from 40 to 80 mass %, based on the total mass of the polymer A1.

[Constitutional Unit a2]

The constitutional unit a2 is a constitutional unit having a carboxylic acid anhydride structure.

The constitutional unit a2 is preferably a constitutional unit having only one carboxylic acid anhydride structure.

As the carboxylic acid anhydride structure, both a chain-like carboxylic acid anhydride structure and a cyclic carboxylic acid anhydride structure can be used, but the carboxylic acid anhydride structure is preferably the cyclic carboxylic acid anhydride structure. The number of membered rings of the above cyclic carboxylic acid anhydride structure is preferably from 5 to 7, more preferably 5 or 6, and still more preferably 5.

Other ring structure may be condensed with or bonded to the cyclic carboxylic acid anhydride structure to form a polycyclic structure, but no polycyclic structure is preferably formed. When the other ring structure is condensed with or bonded to the cyclic carboxylic acid anhydride structure, it is preferable that the other ring structure is condensed with the cyclic carboxylic acid anhydride structure in a form providing a bicyclo structure, or the other ring structure is bonded to the cyclic carboxylic acid anhydride structure in a form providing a spiro structure. The number of the other ring structures condensed or bonded is preferably from 1 to 5, and more preferably from 1 to 3. The other examples of the ring structures include a cyclic hydrocarbon group having from 3 to 20 carbon atoms, and a hetero ring group having from 3 to 20 carbon atoms. Examples of the hetero ring group include, but are not particularly limited to, a hetero ring group in which one or more atoms contained in a ring are hetero atoms, or an aromatic hetero ring group. The hetero ring group is preferably a five-membered ring or a six-membered ring, and particularly preferably a five-membered ring. Specifically, the hetero ring group is preferably a hetero ring group containing at least one oxygen atom, and examples thereof include an oxolane ring, an oxane ring, and a dioxan ring.

The carboxylic acid anhydride structure used in the present disclosure may have a substituent or may have no substituent, and preferably has no substituent. Examples of the substituent include, but are not particularly limited to, an alkyl group having from 1 to 8 carbon atoms, a cycloalkyl group having from 3 to 7 carbon atoms, an alkoxy group having from 1 to 8 carbon atoms, an alkoxycarbonyl group having from 2 to 8 carbon atoms, a carboxy group, a halogen atom, a hydroxyl group, and a cyano group. The substituent is more preferably an alkyl group having from 1 to 4 carbon atoms or a cyano group. The alkyl group is preferably a straight-chain alkyl group having from 1 to 6 carbon atoms, a branched alkyl group having from 3 to 6 carbon atoms, or a cyclic alkyl group having from 3 to 6 carbon atoms, and more preferably a straight-chain alkyl group having from 1 to 3 carbon atoms. When the carboxylic acid anhydride structure has a substituent, the number of substituents is not particularly limited, and is preferably from 1 to 4, and more preferably 1 or 2. When the carboxylic acid anhydride structure used in the present disclosure has a plurality of substituents, the plurality of substituents may be the same or different. When the other ring structure is condensed with the carboxylic acid anhydride structure, the other ring structure may have a substituent.

The constitutional unit having the carboxylic acid anhydride structure used in the present disclosure preferably contains a partial structure represented by the following Formula 2.

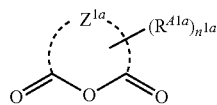

Formula 2

In the Formula 2, $R^{A1a}$ represents a substituent; and $n^{1a}$ $R^{A1a}$ are independent from each other, and may be the same or different. $Z^{1a}$ represents a divalent group forming a ring containing —C(=O)—O—C(=O)—. $n^{1a}$ represents an integer of 0 or more.

In the Formula 2, $R^{A1a}$ represents a substituent; $n^{1a}$ $R^{A1a}$ are independent from each other, and may be the same or different. $R^{A1a}$ have the same meaning as that of above-mentioned substituent that may be contained in the carboxylic acid anhydride structure, and preferable ranges thereof are also the same.

In the Formula 2, $Z^{1a}$ represents a divalent group forming a ring containing —C(=O)—O—C(=O)—. $Z^{1a}$ represents preferably an alkylene group having from 2 to 4 carbon atoms, more preferably an alkylene group having from 2 to 3 carbon atoms, and still more preferably an alkylene group having 2 carbon atoms.

The above partial structure may be condensed with other ring structure in a form providing a bicyclo structure, or bonded to the other ring structure in a form providing a spiro structure, but it is preferable that the partial structure is not condensed with or not bonded to the other ring structure. The other ring structure has the same meaning as that of the above-mentioned other ring structure, and preferable ranges thereof are also the same.

In the Formula 2, $n^{1a}$ represents an integer of 0 or more. When $Z^{1a}$ represents an alkylene group having from 2 to 4 carbon atoms, $n^{1a}$ is preferably an integer from 0 to 4, more preferably an integer from 0 to 2, and still more preferably 0. When $n^{1a}$ represents an integer of 2 or more, a plurality of substituents that are present may be the same or different. The plurality of substituents that are present may be bonded to each other to form a ring, but it is preferable that the plurality of substituents are not bonded to each other to form a ring.

The constitutional unit a2 is preferably a constitutional unit derived from an unsaturated carboxylic acid anhydride, more preferably a constitutional unit derived from an unsaturated cyclic carboxylic acid anhydride, still more preferably a constitutional unit derived from an unsaturated aliphatic cyclic carboxylic acid anhydride, yet still more preferably a constitutional unit derived from maleic acid anhydride or itaconic acid anhydride, and particularly preferably a constitutional unit derived from maleic acid anhydride.

Hereinafter, specific examples of the constitutional unit a2 will be given, but the constitutional unit a2 in the polymer A1 used in the present disclosure is not limited thereto. In the following constitutional unit, Rx represents a hydrogen atom, a methyl group, a CH$_2$OH group, or a CF$_3$ group, and Me represents a methyl group.

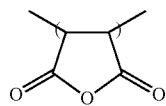

Formula a2-1

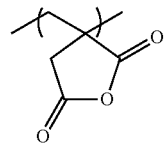

Formula a2-2

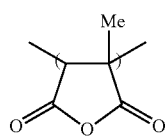

Formula a2-3

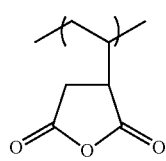

Formula a2-4

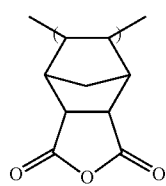

Formula a2-5

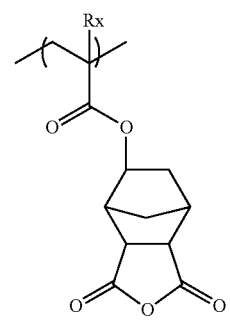

Formula a2-6

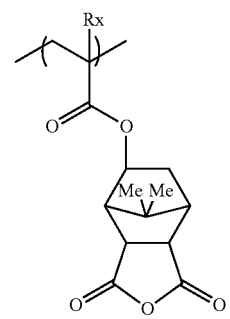

Formula a2-7

Formula a2-8
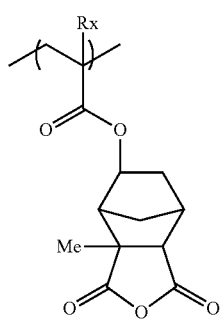
Formula a2-9
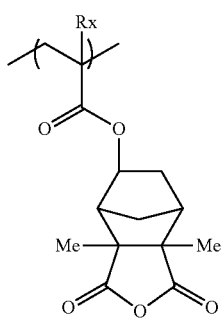
Formula a2-10
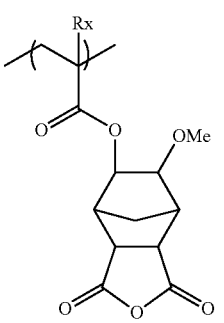
Formula a2-11
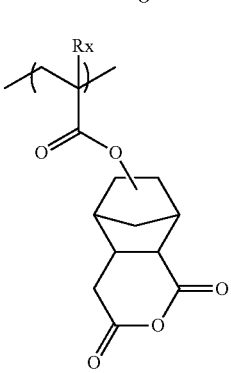
Formula a2-12
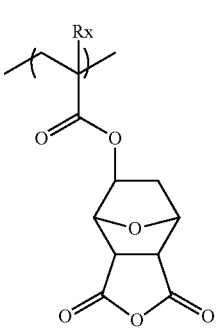
Formula a2-13
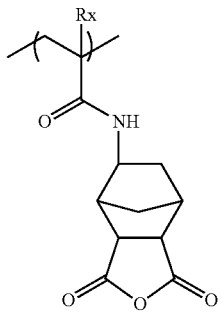
Formula a2-14
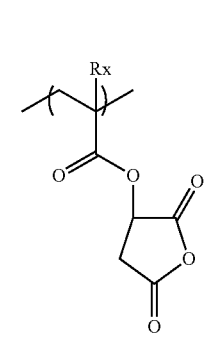
Formula a2-15
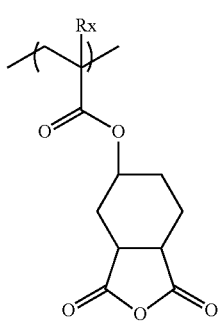
Formula a2-16
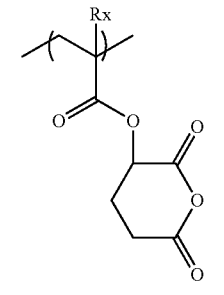
Formula a2-17
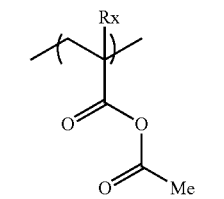

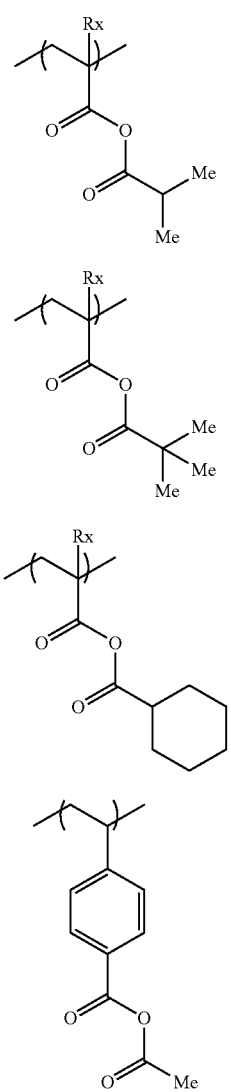

Formula a2-18

Formula a2-19

Formula a2-20

Formula a2-21

The constitutional unit a2 contains preferably a constitutional unit represented by at least one Formula selected from the group consisting of the above Formula a2-1 to the Formula a2-21, and more preferably a constitutional unit represented by any of the above Formulae a2-1 to a2-21.

The constitutional unit a2 contains preferably the constitutional unit represented by the Formula a2-1 and/or the constitutional unit represented by the Formula a2-2 in the above specific examples, and more preferably the constitutional unit represented by the Formula a2-1.

The constitutional unit a2 contains preferably the constitutional unit represented by the Formula a2-1 and/or the constitutional unit represented by the following Formula a2-2, and more preferably the constitutional unit represented by the Formula a2-1.

The content of the constitutional unit a2 in the polymer A1 is preferably from 5 to 60 mass %, more preferably from 5 to 40 mass %, and still more preferably from 10 to 35 mass %, based on the total mass of the polymer A1.

The total content of the constitutional unit a1 and constitutional unit a2 in the polymer A1 is preferably 70 mass % or more, more preferably 90 mass % or more, and still more preferably 95 mass % or more, based on the total mass of the polymer A1. The upper limit of the above total content is not particularly limited, and may be 100 mass % or less.

[Constitutional Unit a3]

The polymer A1 may contain a constitutional unit a3 other than the constitutional unit a1 and the constitutional unit a2.

It is preferable that the constitutional unit a3 does not contain an acid radical from the viewpoint of reducing the acid value of the photosensitive composition to be described later.

Examples of the constitutional unit a3 include, but are not particularly limited to, a constitutional unit derived from a monofunctional ethylenically unsaturated compound. As the above monofunctional ethylenically unsaturated compound, known compounds can be used without particular limitation. There are preferably used (meth)acrylic acid derivatives such as methyl(meth)acrylate, ethyl(meth)acrylate, n-butyl (meth)acrylate, 2-ethylhexyl(meth)acrylate, carbitol(meth) acrylate, cyclohexyl(meth)acrylate, benzyl(meth)acrylate, and epoxy(meth)acrylate, N-vinyl compounds such as N-vinylpyrrolidone and N-vinylcaprolactam, or derivatives of allyl compounds such as allyl glycidyl ether.

The content of the constitutional unit a3 in the polymer A1 is preferably from 0 to 10 mass %, more preferably from 0 to 5 mass %, and still more preferably from 0 to 2 mass %, based on the total mass of the polymer A1.

[Characteristics of Polymer A1]

—Content—

The content of the polymer A1 in the photosensitive composition of the present disclosure is preferably from 0.5 to 8 mass %, more preferably from 1 to 7 mass %, and still more preferably from 2 to 6 mass % or more, based on the total solid content of the photosensitive composition. The above range provides excellent perspiration resistance of the cured product to be obtained and excellent suppression of footing.

—Ratio of Constitutional Unit a1 to Constitutional Unit a2—

The molar content ratio of the constitutional unit a1 to the constitutional unit a2 in the polymer A1 is a1:a2=3:1 to 6:1, preferably a1:a2=3.5:1 to 6:1, and more preferably a1:a2=4:1 to 6:1. The above range provides a photosensitive composition providing both excellent perspiration resistance of the cured film to be obtained and excellent suppression of footing.

—Acid Anhydride Value—

The acid anhydride value of the polymer A1 is from 1.30 to 3.00 mmol/g, preferably from 1.40 to 2.60 mmol/g, more preferably from 1.55 to 2.50 mmol/g, and particularly preferably from 1.65 to 2.30 mmol/g.

The acid anhydride value of the polymer A1 can be calculated by measuring an amount of reaction between octylamine and acid anhydride, for example. Specific examples thereof include the following technique.

Solutions A and B having the following compositions are prepared. The solution B is stirred under a room temperature (25° C.) condition for 2 hours, to complete the reaction. The solution A and the solution B are titrated with a 0.5 mol/l hydrochloric acid aqueous solution, to calculate the valence A (mmol/g) of amine of the solution A and the valence B (mmol/g) of amine of the solution B. Furthermore, the acid anhydride value of the polymer A1 can be calculated from the following calculation Formula.

Amount of acid anhydride of solution $B$ (mmol)=valence $A$ of amine of solution $A$×weighing value (g) of solution $A$ used in preparation of solution $B$−valence $B$ of amine of solution $B$×(weighing value (g) of solution $A$ used in preparation of solution $B$+weighing value (g) of solution $A1$ used in preparation of solution $B$)

Acid anhydride value of polymer $A1$ (mmol/g)= amount of acid anhydride of solution $B$/weighing value of polymer $A1$ used in preparation of solution $B$ Solution A: 10 mass % MFG (methyl propylene glycol) solution of octylamine Solution B: Mixture of polymer A1 and amine solution A For example, the mixture ratio of the polymer A1 used in preparation of the solution B to the solution A can be adjusted so that the acid amount of the polymer A1 in the solution B and the amount of amine of the solution A are made to substantially coincide with each other or the amount of amine of the solution A is excessive. The acid amount of the polymer A1 means a total acid amount in a state where the acid anhydride contained in the polymer A1 is hydrolyzed, and can be obtained from the product of the total acid value of the polymer A1 and the weighing value of the polymer A1, or the like in a state where the acid anhydride contained in the polymer A1 is hydrolyzed. The amount of amine of the solution A can be calculated from the product of the valence of amine of the solution A and the weighing value of the solution A, or the like.

<Particles>

The photosensitive composition of the present disclosure contains particles. The photosensitive composition containing the particles provides more excellent adhesion and hardness of the cured film.

The particles are preferably inorganic particles and/or organic particles, and more preferably inorganic particles.

The number average primary particle size of the particles used in the present disclosure is from 1 to 200 nm, more preferably from 1 to 150 nm, still more preferably from 1 to 100 nm, and particularly preferably from 1 to 50 nm. The number average primary particle size means the arithmetic average of the particle sizes of any 200 particles measured using an electron microscope. When the shape of the particles is not spherical, the size means a size of a circle equivalent calculated from a projected area.

From the viewpoint of the hardness of the cured film, the void ratio of the inorganic particles is preferably less than 10%, more preferably less than 3%, and most preferably there is no void. The void herein means a pore portion in a particle seen when the section of the particle is observed. The void ratio of the particles means the arithmetic average of 200 area ratios of a void portion of a section image obtained by an electron microscope to the entire particle.

[Inorganic Particles]

Examples of the inorganic particles include metal particles, metal oxide particles, and mica particles from the viewpoints of the stability of the particles, and the hardness, transparency, and refractive-index adjusting properties of the cured film.

—Metal Particles—

As the metal particles, both a transition metal element and a typical metal element can be applied. For example, iron, cobalt, nickel, ruthenium, rhodium, palladium, osmium, iridium or platinum belonging to VIII group in periodic table, and copper, silver, or gold belonging to IB group in periodic table, or the like are preferably applied. These are used in various applications. Among these, gold, silver, platinum, palladium, copper, or nickel that has excellent conductivity is preferable; copper, silver, or nickel is more preferable; and silver is still more preferable. These are not limited to one kind, and two or more kinds thereof may be used in combination. The metal particles may be made of an alloy.

—Metal Oxide Particles—

The metal oxide particles are preferably metal oxide particles containing an atom such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, or Te, more preferably metal oxide particles containing silicon oxide, titanium oxide, titanium composite oxide, zinc oxide, zirconium oxide, indium/tin oxide, or antimony/tin oxide, still more preferably metal oxide particles containing silicon oxide, titanium oxide, titanium composite oxide, or zirconium oxide, and particularly preferably metal oxide particles containing silicon oxide, titanium oxide, or zirconium oxide from the viewpoints of the stability and availability of the particles, and the hardness, transparency, and refractive index adjustment of the cured film, or the like.

Preferable examples of the silicon oxide include silica, and more preferable examples thereof include silica particles.

The silica particles particularly pose no problem as long as the silica particles are inorganic oxide particles containing silica dioxide, and particles mainly containing silica dioxide or a hydrate thereof (preferably, 80 mass % or more) are preferable. The above particles may contain an aluminate as a component in small amounts (for example, less than 5 mass %). Examples of the aluminate that may be contained as a component in small amounts include sodium aluminate and potassium aluminate. The silica particles may contain an inorganic salts such as sodium hydroxide, potassium hydroxide, lithium hydrate, and ammonium hydroxide, or organic salts such as tetramethylammoniumhydroxide. Examples of such a compound include colloidal silica.

A dispersion medium for the colloidal silica is not particularly limited, and may be any of water, an organic solvent, and a mixture thereof. These may be used singly, or in combination of two or more kinds thereof.

—Mica Particles—

As the mica particles, mica particles described in paragraph 0067 in International Patent Laid-open No. 2015/076160 can be preferably used.

Commercial products can also be used as the inorganic particles, and examples thereof include PMA-ST (manufactured by Nissan Chemical Industries, Ltd.), MIBK-ST-L (manufactured by Nissan Chemical Industries, Ltd.), TTO-51 (manufactured by Ishihara Sangyo Kaisha, Ltd.), and silver nanoparticles (manufactured by Adachi New Industrial Companies).

[Organic Particles]

As the organic particles, polymer particles are preferably used.

Examples of materials for the polymer particles include linear polymers such as polystyrene, polymethylmethacrylate, polyethylene, polypropylene, polyethyleneterephthalate, polybutyleneterephthalate, polysulfone, polycarbonate, and polyamide; divinylbenzene, hexatriene, divinylether, divinylsulfone, diallyl carbinol, alkylenediacrylate, oligo or polyalkylene glycoldiacrylate, oligo or polyalkylene glycoldimethacrylate, alkylenetriacrylate, alkylenetetraacrylate, alkylenetrimethacylate, alkylenetetramethacrylate, alkylenebisacrylamide, alkylenebismethacrylamide, and network polymers obtained by polymerizing both-ends acryl denatured polybutadiene oligomer or the like solely or together with other polymerizable monomer; thermosetting resins such as a phenol-formaldehyde resin, a melamine-formaldehyde resin, a benzoguanamine-formaldehyde resin, and an urea-formaldehyde resin; and resins obtained by copolymerizing silane-containing monomers such as γ-(meth)acryloxyprophyltrimethoxysilane, trimethoxysilylstyrene, and vinyltrimetoxysilane solely or together with other polymerizable monomer.

Commercial products can also be used as the polymer particles, and examples thereof include Chemisnow-MP-1451 (manufactured by Soken Chemical & Engineering Co., Ltd.).

In the present disclosure, the particles may be supplied for use as a dispersion liquid prepared by mixing and dispersing in an appropriate dispersant and solvent using a mixer such as a ball mill or a rod mill. In the photosensitive composition of the present disclosure, it is not indispensable that the above-mentioned colloidal silica is present in a colloidal state.

When the particles are blended, the content of the particles is preferably 1 mass % or more, more preferably 5 mass % or more, and still more preferably 10 mass % or more, based on the total solid content of the photosensitive composition from the viewpoint of the hardness of the cured film. The content of the particles is preferably 80 mass % or less, more preferably 60 mass % or less, still more preferably 40 mass % or less, and particularly preferably 35 mass % or less.

With regard to the particles, only one kind may be contained or two or more kinds may be contained. When two or more kinds are contained, the total amount is preferably in the above range.

<Solvent>

The photosensitive composition of the present disclosure contains a solvent.

The photosensitive composition of the present disclosure is preferably prepared as a solution obtained by dissolving a compound having two or more ethylenically unsaturated groups, a photopolymerization initiator, a polymer A1, and particles that are essential components, and optional components to be described later, in a solvent.

As the solvent used in the photosensitive composition of the present disclosure, a known solvent may be used, and examples thereof include an ethylene glycol monoalkyl ether, an ethylene glycol dialkyl ether, an ethylene glycol monoalkyl ether acetate, a propylene glycol monoalkyl ether, a propylene glycol dialkyl ether, a propylene glycol monoalkyl ether acetate, a diethylene glycol dialkyl ether, a diethylene glycol monoalkyl ether acetate, a dipropylene glycol monoalkyl ether, a butylene glycol diacetate, a dipropylene glycol dialkyl ether, a dipropylene glycol monoalkyl ether acetate, an ester, a ketone, an amide, and a lactone. Solvents described in paragraph 0062 of JP-A No, 2009-098616 may also be cited as specific examples of the solvents. Specific examples thereof include propyleneglycolmonomethyletheracetate or methylethyldiglycol.

The boiling point of the solvent is preferably from 100° C. to 300° C., and more preferably from 120° C. to 250° C. from the viewpoint of applying properties.

The solvents that can be used in the present disclosure may be used singly, or in combination of two or more kinds thereof. Solvents having different boiling points are also preferably used in combination.

The content of the solvent in the photosensitive composition of the present disclosure is preferably from 100 to 3,000 parts by mass, more preferably from 200 to 2,000 parts by mass, and still more preferably from 250 to 1,000 parts by mass, per 100 parts by mass of the solid content from the viewpoint of adjusting the viscosity of the photosensitive composition to a viscosity suitable for the application.

The solid content concentration of the photosensitive composition is preferably from 3 to 50 mass %, and more preferably from 20 to 40 mass %.

The viscosity of the photosensitive composition is preferably from 1 to 200 mPa·s, more preferably from 2 to 100 mPa·s, and most preferably from 3 to 800 mPa·s. The viscosity is preferably measured with an RE-80L model rotary viscometer manufactured by Toki Sangyo at 25±0.2° C., for example. The revolution speed in measurement is 100 rpm for a range of less than 5 mPa·s; 50 rpm for a range of from 5 mPa·s to less than 10 mPa·s; 20 rpm for a range of from 10 mPa·s to less than 30 mPa·s; and 10 rpm for a range of 30 mPa·s or more.

<Polymerization Inhibitor>

The photosensitive composition of the present disclosure preferably contains a polymerization inhibitor. Due to it containing the polymerization inhibitor, a polymerization reaction due to the leakage of light is suppressed, and the developability is excellent.

The polymerization inhibitor is a substance that carries out hydrogen supply (or the imparting of hydrogen), energy supply (or the imparting of energy), electron supply (or the imparting of an electron), or the like to a polymerization-initiating radical component generated from a polymerization initiator upon exposure or heat to thus deactivate a polymerization-initiating radical and inhibit initiation of polymerization. For example, compounds described in paragraphs 0154 to 0173 of JP-A No. 2007-334322, or the like may be used.

With respect to the kind of the polymerization inhibitors, polymerization inhibitors that provide high contrast and do not lower sensitivity are preferably adopted. Examples of the polymerization inhibitors include phenothiazine derivatives such as phenothiazine, chlorpromazine, levomepromazine, fluphenazine, and thioridazine; phenoxazine derivatives such as phenoxazine, 3,7-bis(diethylamino) phenoxazine-5-ium perchlorate, 5-amino-9-(dimethylamino)-10-methylbenzo[a]phenoxazine-7-ium chloride, 7-(pentyloxy)-3H-phenoxazine-3-one, 5,9-diamonobenzo[a]phenoxazine-7-ium acetate, and 7-ethoxy-3H-phenoxazine-3-one; stable radicals such as tri-p-nitrophenyl methyl, diphenyl picrylhydrazyl, and calvinoxyl; quinones such as quinone, benzoquinone, chlorobenzoquinone, 2,5-di-chlorobenzoquinone, 2,6-di-chlorobenzoquinone, 2,3-di-methylbenzoquinone, 2,5-di-methylbenzoquinone, methoxybenzoquinone, methylbenzoquinone, tetrabromobenzoquinone, tetrachlorobenzoquinone, tetramethylbenzoquinone, trichlorobenzoquinone, trimethylbenzoquinone, amylquinone, amyloxyhydroquinone, 2,5-di-t-butylhydroquinone, and 2,5-diphenyl-p-benzoquinone; naphthols such as α-naphthol, 2-nitro-1-naphthol, β-naphthol, and 1-nitro-2-naphthol; phenols such as 4-methoxyphenol, 4-ethoxyphenol, hydroquinone, phenol, t-butylcatechol, methylhydroquinone, n-butylphenol, hydroquinone monopropyl ether, t-butylcresol, p-cresol, 2,6-di-t-butyl-p-cresol, catecholresorcin, o-t-butylphenol, 2,6-di-p-methoxyphenol, 2,6-di-t-butylphenol, 2,4-di-t-butylphenol, 3,5-di-t-butylphenol, 3,5-di-t-butyl-4-hydroxybenzoic acid, N,N'-bis-3-(3',5'-di-t-butyl-4-hydroxyphenyl) propionylhexamethylenediamine, 2,2'-methylenebis(6-t-butyl-p-cresol), n-octadecyl-3-(4-hydroxy-3',5'-di-t-buthylphenyl)propionate, distearyl(4-hydroxy-3-methyl-5-t-butyl)benzylmalonate, 2,4,6-tri-t-butylphenol, 1,6-hexandiolbis[3-(3,5-di-t-butyl-4-hydroxyphenyl) propionate], triethyleneglycolbis[3-(3-t-butyl-5-methyl-4-hydroxyphenyl)propionate], 2,2-thiodiethylenebis[3-(3,5-di-t-butyl-4-hydroxyphenyl)propionate], 3,9-bis[1,1-dimethyl-2-[β-(3-t-butyl-4-hydroxy-5-methylphenyl) propionyloxyethyl-2,4,8,10-tetraoxaspiro[5.5]undecane, 2,2'-ethylidenebis(2,4-di-t-butylphenol), 1,1,3-tris(2- methyl-4-hydroxy-5-t-buthylphenylbutane, 1,3,5-trimethyl-2,4,6-tris(3,5-di-t-butyl-4-hydroxybenzyl)benzene, tris(3,5-di-t-butyl-4-hydroxybenzyl)isocyanate, tris[2-(3',5'-di-t-butyl-4'-hydroxyhydrocinnamoiloxyl)ethyl]isocyanate, tris (4-t-butyl-2,6-dimethyl-3-hydroxybenzyl)isocyanate, and tetrakis[methylene-3-(3',5'-di-t-butyl-4'-hydroxyphenyl) propionate]methane; nitrophenols such as 2,4-dinitrophenol, o-nitrophenol, m-nitrophenol, and p-nitrophenol; gallic acids such as gallic acid, methyl gallate, propyl gallate, and isoamyl gallate; pigments such as methylene blue and malachite green; amines such as β-naphthylamine, an N-nitrosocyclohexylamine salt, and di-p-fluorophenylamine; and pyrogallol, monobenzylether, benzoquinone, triphenylphosphine, cuprous chloride, phenothiazine, chloranil, pyridine, nitrobenzene, dinitrobenzene, p-toluidine, picric acid, and methyl salicylate.

Particularly preferable examples of the polymerization inhibitor include at least one selected from the group consisting of phenothiazine, phenoxazine, hindered amine, and derivatives thereof.

Examples of phenothiazine and derivatives thereof include phenothiazine, bis(α-methylbenzyl)phenothiazine, 3,7-dioctylphenothiazine, bis(α-dimethylbenzyl)phenothiazine, fluphenazine, and thioridazine, and phenothiazine is preferable.

Examples of phenoxazine and derivatives thereof include phenoxazine, 3,7-bis(diethylamino)phenoxazine-5-ium perchlorate, 5-amino-9-(dimethylamino)-10-methylbenzo[a]phenoxazine-7-ium chloride, 7-(pentyloxy)-3H-phenoxazine-3-one, 5,9-diaminobenzo[a]phenoxazine-7-ium acetate, and 7-ethoxy-3H-phenoxazine-3-one, and phenoxazine is preferable.

Examples of hindered amine and derivatives thereof include CHIMASSORB 2020 FDL and TINUVIN 144, 765, and 770 (all manufactured by BASF), and TINUVIN 144 is preferable.

The polymerization inhibitors may be contained singly, or in combination of two or more kinds thereof.

The content of the polymerization inhibitor in the photosensitive composition of the present disclosure is not particularly limited, and is preferably from 0.005 to 0.5 mass %, and more preferably from 0.01 to 0.5 mass %, based on the total solid content of the photosensitive composition. Patterning properties can be improved without impairing sensitivity by adjusting the amount blended of the polymerization inhibitor.

<Alkoxysilane Compound>

The photosensitive composition of the present disclosure preferably contains an alkoxysilane compound. When the alkoxysilane compound is used, adhesion between the film formed by the photosensitive composition of the present disclosure and the substrate can be improved.

The alkoxysilane compound is not particularly limited as long as it is a compound having at least one alkoxy group directly bonded to a silicon atom, and is preferably a dialkoxysilyl group- and/or trialkoxysilyl group-containing compound, and more preferably a trialkoxysilyl group-containing compound.

The alkoxysilane compound that can be used in the photosensitive composition of the present disclosure is preferably a compound that improves adhesion between a cured film and a substrate such as a silicon compound (such as silicon, silicon oxide, or silicon nitride), or a metal (such as gold, copper, molybdenum, titanium, or aluminum). Specifically, a known silane coupling agent or the like is also effective. A silane coupling agent having an ethylenically unsaturated group is preferable.

Examples of the silane coupling agent include γ-aminopropyltrimethoxysilane, γ-aminopropyltriethoxysilane, γ-glycidoxypropyltrialkoxysilane, γ-glycidoxypropyldialkoxysilane, γ-methacryloxypropyltrialkoxysilane, γ-methacryloxypropyldialkoxysilane, γ-chloropropyltrialkoxysilane, γ-mercaptopropyltrialkoxysilane, β-(3,4-epoxycyclohexyl)ethyltrialkoxysilane, and vinyltrialkoxysilane. Among these, γ-methacryloxypropyltrialkoxysilane, γ-acryloxypropyltrialkoxysilane, vinyltrialkoxysilane, or γ-glycidoxypropyltriacoxysilane is more preferable. These may be used singly, or in combination of two or more kinds thereof.

Examples of commercial products include KBM-403 and KBM-5103 manufactured by Shin-Etsu Chemical Co., Ltd.

With regard to the alkoxysilane compound, only one kind may be contained or two or more kinds may be contained.

The content of the alkoxysilane compound in the photosensitive composition of the present disclosure is preferably from 0.1 to 30 mass %, more preferably from 2 to 20 mass %, and still more preferably from 2 to 15 mass %, based on the total solid content of the photosensitive composition. When two or more kinds of the alkoxysilane compound are contained, the total amount is preferably in the above range.

<Surfactant>

The photosensitive composition of the present disclosure may contain a surfactant.

As the surfactant, any of anionic, cationic, nonionic, or amphoteric surfactants may be used, and the nonionic surfactant is preferable. The surfactant is preferably a nonionic surfactant, and more preferably a fluorine-based surfactant.

Examples of the surfactant that can be used in the present disclosure include commercial products such as Megafac F142D, F172, F173, F176, F177, F183, F479, F482, F554, F780, F781, F781-F, R30, R08, F-472SF, BL20, R-61, and R-90 (manufactured by DIC), Fluorad FC-135, FC-170C, FC-430, and FC-431, and Novec FC-4430 (manufactured by Sumitomo 3M Limited), AsahiGuard AG7105, 7000, 950, and 7600, and Surflon S-112, S-113, S-131, S-141, S-145, S-382, SC-101, SC-102, SC-103, SC-104, SC-105, and SC-106 (manufactured by Asahi Glass), Eftop EF351, 352, 801, and 802 (manufactured by Mitsubishi Materials Electronic Chemicals Co., Ltd.), and Ftergent 250 (manufactured by Neos Company Limited). Examples other than the above include KP (manufactured by Shin-Etsu Chemical Co., Ltd.), Polyflow (manufactured by Kyoeisha Chemical Co., Ltd.), Eftop (manufactured by Mitsubishi Materials Electronic Chemicals Co., Ltd.), Megafac (manufactured by DIC), Fluorad (manufactured by Sumitomo 3M Limited), AsahiGuard and Surflon (manufactured by Asahi Glass), and PolyFox (manufactured by OMNOVA) series.

Preferable examples of the surfactant include a copolymer containing a constitutional unit A and a constitutional unit B that are represented by the following Formula W and having a weight average molecular weight (Mw) of from 1,000 to 10,000. The weight average molecular weight (Mw) is (polystyrene converted) measured by gel permeation chromatography (GPC) when tetrahydrofuran is used as a solvent.

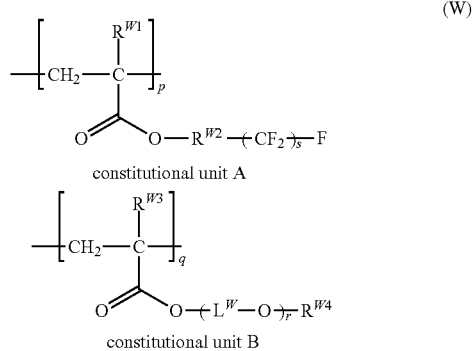

(W)

constitutional unit A constitutional unit B

In the Formula W, $R^{W1}$ and $R^{W3}$ each independently represent a hydrogen atom or a methyl group; $R^{W2}$ represents a straight-chain alkylene group having from 1 to 4 carbon atoms; $R^{W4}$ represents a hydrogen atom or an alkyl group having from 1 to 4 carbon atoms; $L^W$ represents an alkylene group having from 3 to 6 carbon atoms; p and q represent mass percentages showing polymerization ratio; p represents a numerical value of from 10 mass % to 80 mass %; q represents a numerical value of from 20 mass % to 90 mass %; r represents an integer from 1 to 18; and s represents an integer from 1 to 10.

$L^W$ above is preferably a branched alkylene group represented by the following Formula W-2. $R^{W5}$ in the Formula W-2 represents an alkyl group having from 1 to 4 carbon atoms; from the viewpoints of miscibility and wettability toward a surface to be applied, it is preferably an alkyl group having from 1 to 3 carbon atoms, and more preferably an alkyl group having 2 or 3 carbon atoms.

The sum (p+q) of p and q in the Formula W is preferably p+q=100, that is, 100 mass %.

The weight average molecular weight (Mw) of the copolymer is more preferably from 1,500 to 5,000.

(W-2)

When blended, the content of the surfactant in the photosensitive composition of the present disclosure is preferably from 0.001 to 5.0 parts by mass, and more preferably from 0.01 to 2.0 parts by mass, based on 100 parts by mass of the total solid content of the photosensitive composition.

With regard to the surfactant, only one kind may be contained or two or more kinds may be contained. When two or more kinds are contained, the total amount is preferably in the above range.

<Compound Having Epoxy Group, Compound Having Oxetanyl Group, and Block Isocyanate Compound>

The photosensitive composition of the present disclosure may contain at least one selected from the group consisting of a compound having an epoxy group, a compound having an oxetanyl group, and a block isocyanate compound. With the above aspect, the cured film to be obtained has more excellent hardness.

[Compound Having Epoxy Group]

The photosensitive composition of the present disclosure may contain a compound having an epoxy group. The compound having an epoxy group may have only one epoxy group per molecule, but it preferably has two or more epoxy groups.

Specific examples of the compound having two or more epoxy groups per molecule include a bisphenol A epoxy resin, a bisphenol F epoxy resin, a phenol novolac epoxy resin, a cresol novolac epoxy resin, and an aliphatic epoxy resin.

These may be obtained as commercial products. Examples of the bisphenol A epoxy resin include JER827, JER828, JER834, JER1001, JER1002, JER1003, JER1055, JER1007, JER1009, and JER1010 (all manufactured by Japan Epoxy Resins Co., Ltd.), and EPICLON860, EPICLON1050, EPICLON1051, and EPICLON1055 (all manufactured by DIC); examples of the bisphenol F epoxy resin include JER806, JER807, JER4004, JER4005, JER4007, and JER4010 (all manufactured by Japan Epoxy Resins Co., Ltd), EPICLON830 and EPICLON835 (both manufactured by DIC), and LCE-21 and RE-6025 (both manufactured by Nippon Kayaku Co., Ltd.); examples of the phenol novolac epoxy resin include JER152, JER154, JER157S70, and JER157S65 (all manufactured by Japan Epoxy Resins Co., Ltd), and EPICLON N-740, EPICLON N-740, EPICLON N-770, and EPICLON N-775 (all manufactured by DIC); examples of the cresol novolac epoxy resin include EPICLON N-660, EPICLON N-665, EPICLON N-670, EPICLON N-673, EPICLON N-680, EPICLON N-690, and EPICLON N-695 (all manufactured by DIC), and EOCN-1020 (manufactured by Nippon Kayaku Co., Ltd.); and examples of the aliphatic epoxy resin include ADEKA RESIN EP-40805, ADEKA RESIN EP-4085S, and ADEKA RESIN EP-40885 (all manufactured by ADEKA), and Celloxide 2021P, Celloxide 2081, Celloxide 2083, Celloxide 2085, EHPE3150, EPOLEAD PB 3600, and EPOLEAD PB 4700 (all manufactured by Daicel Chemical Industries, Ltd.). Other examples include ADEKA RESIN EP-40005, ADEKA RESIN EP-4003S, ADEKA RESIN EP-4010S, and ADEKA RESIN EP-4011S (all manufactured by ADEKA), and NC-2000, NC-3000, NC-7300, XD-1000, EPPN-501, and EPPN-502 (all manufactured by ADEKA).

Urethane compounds having an ethylene oxide skeleton described in JP-B Nos. S58-49860, S56-17654, S62-39417, and S62-39418 can also be suitably used, and the contents of which are incorporated herein.

When the photosensitive composition of the present disclosure contains the compound having an epoxy group, the content of the compound is preferably in a range of from 0.1 to 20 mass % of the total solid content of the composition, more preferably in a range of from 0.5 to 10 mass %, and still more preferably in a range of from 1 to 5 mass %.

The photosensitive composition of the present disclosure may contain only one kind or two or more kinds of the compound having an epoxy group. When two or more kinds are contained, the total amount is preferably in the above range.

[Compound Having Oxetanyl Group]

The photosensitive composition of the present disclosure may contain a compound having an oxetanyl group. The compound having an oxetanyl group may have only one oxetanyl group per molecule, but it preferably has two or more oxetanyl groups.

As specific examples of the compound having an oxetanyl group, Aron oxetane OXT-121, OXT-221, OX-SQ, and PNOX (all manufactured by Toagosei Co., Ltd.) can be used.

The compound containing an oxetanyl group is preferably used singly, or as a mixture with a compound containing an epoxy group.

When the photosensitive composition of the present disclosure contains the compound having an oxetanyl group, the content of the compound is preferably in a range of from 0.1 to 20 mass % of the total solid content of the composition, more preferably in a range of from 0.5 to 10 mass %, and still more preferably in a range of from 1 to 5 mass %.

The photosensitive composition of the present disclosure may contain only one kind or two or more kinds of the compound having an oxetanyl group. When two or more kinds are contained, the total amount is preferably in the above range.

[Block Isocyanate Compound]

The photosensitive composition of the present disclosure may contain a block isocyanate compound.

The block isocyanate compound is not particularly limited as long as it is a compound having a block isocyanate group. However, the block isocyanate compound is preferably a compound having two or more block isocyanate groups per molecule from the viewpoint of curability. The upper limit of the number of the block isocyanate groups is not particularly set, but it is preferably 6 or less.

The skeleton of the block isocyanate compound is not particularly limited as long as the block isocyanate compound has two isocyanate groups per molecule. The block isocyanate compound may be an aliphatic, alicyclic, or aromatic polyisocyanate. Examples of the block isocyanate compound that can be suitably used include isocyanate compounds such as 2,4-trylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethylether diisocyanate, diphenylmethane-4,4'-diisocyanate, (o, m, or p)-xylene diisocyanate, methylene bis(cyclohexylisocyanate), cyclohexane-1,3-dimethylene diisocyanate, cyclohexane-1,4-dimethylene diisocyanate, 1,5-naphthalene diisocyanate, p-phenylene diisocyanate, 3,3'-methylene ditolylene-4,4'-diisocyanate, 4,4'-diphenylether diisocyanate, tetrachlorophenylene diisocyanate, norbornane diisocyanate, and hydrogenated (1,3- or 1,4-)xylylene diisocyanate, and compounds having a prepolymer type skeleton derived from these compounds. Among these, tolylene diisocyanate (TDI), diphenylmethane diisocyanate (MDI) and hexamethylene diisocyanate (HDI), or isophorone diisocyanate (IPDI) is particularly preferable.

Examples of the mother structure of the block isocyanate compound in the photosensitive composition of the present disclosure include a biuret type, an isocyanurate type, an adduct type, and a bifunctional prepolymer type.

Examples of a block agent forming the block structure of the block isocyanate compound include an oxime compound, a lactam compound, a phenol compound, an alcohol compound, an amine compound, an active methylene compound, a pyrazole compound, a mercaptan compound, an imidazole-based compound, and an imide-based compound. Among these, a block agent selected from an oxime compound, a lactam compound, a phenol compound, an alcohol compound, an amine compound, an active methylene compound, and a pyrazole compound is particularly preferable.

The blocked isocyanate compound that can be used in the composition of the present disclosure is available as a commercial product, and, for example, it is possible to preferably use CORONATE AP stable M, CORONATE 2503, 2515, 2507, 2513, 2555, and MILLIONATE MS-50 (all manufactured by Nippon Polyurethane Industry Co., Ltd.), TAKENATE B-830, B-815N, B-820NSU, B-842N, B-846N, B-870N, B-874N, and B-882N (all manufactured by Mitsui Chemicals, Co., Ltd.), DURANATE 17B-60P, 17B-60PX, 17B-60P, TPA-B80X, TPA-B80E, MF-B60X, MF-B60B, MF-K60X, MF-K60B, E402-B80B, SBN-70D, SBB-70P, and K6000 (all manufactured by Asahi Kasei Chemicals Co, Ltd.), DESMODUR BL1100, BL1265 MPA/X, BL3575/1, BL3272MPA, BL3370MPA, BL3475BA/SN, BL5375MPA, VPLS2078/2, BL4265SN, PL340, PL350, and SUMIJULE BL3175 (all manufactured by Sumika Bayer Urethane Co., Ltd.), or the like.

When the photosensitive composition of the present disclosure contains the block isocyanate compound, the content of the block isocyanate compound is preferably in a range of from 0.1 to 20 mass %, more preferably in a range of from 0.5 to 10 mass %, and still more preferably in a range of from 1 to 5 mass %, based on the total solid content of the composition.

The photosensitive composition of the present disclosure may contain only one kind or two or more kinds of the block isocyanate compound. When two or more kinds are contained, the total amount is preferably in the above range.

The photosensitive composition of the present disclosure may contain other compounds other than those described above (for example, alkoxy methyl group-containing compound or the like) within a range not departing from the spirit and scope of the present disclosure. Examples of the alkoxy methyl group-containing compound include those described in paragraphs 0192 to 0194 of JP-A No. 2011-221494.

<Antioxidant>

The photosensitive composition of the present disclosure may contain an antioxidant other than the above components.

As the antioxidant, a known antioxidant may be contained. Due to the antioxidant being added, there are the advantages that the coloration of a cured film can be prevented; a reduction in a film thickness due to decomposition can be suppressed; and the heat-resistant transparency is excellent.

Examples of such an antioxidant include a phosphorus-based antioxidant, an amide, a hydrazide, a hindered phenol-based antioxidant, an ascorbic acid, zinc sulfate, a saccharide, a nitrite salt, a sulfite salt, a thiosulfate, and a hydroxylamine derivative. Among these, from the viewpoints of coloration of a cured film and a reduction in a film thickness, a hindered phenol-based antioxidant and a phosphorus-based antioxidant are particularly preferable, and a hindered phenol-based antioxidant is most preferable. With regard to these, one kind may be used or two or more kinds may be mixed.

Preferable examples of commercial products include ADK STAB AO-60, ADK STAB AO-80 (both manufactured by ADEKA) and Irganox 1098 (manufactured by BASF).

The content of the antioxidant is not particularly limited, and is preferably from 0.1 to 10 mass %, more preferably from 0.2 to 5 mass %, and still more preferably from 0.5 to 4 mass %, based on the total solid content of the photosensitive composition.

<Other Components>

To the photosensitive composition of the present disclosure, other components such as a plasticizer, a thermal acid generator, and an acid increasing agent other than those described above may be added if necessary. As these components, for example, it is possible to use components described in JP-A Nos. 2009-98616 and 2009-244801, and other known components. Various ultraviolet absorbents and metal inactivators or the like described in "Kobunshi Tenkazai no Shintenkai (New Development of Polymer Additives; Nikkan Kogyo Shimbun, Ltd.)" may also be added to the photosensitive composition of the present disclosure.

<Method of Preparing Photosensitive Composition>

A method of preparing the photosensitive composition of the present disclosure is not particularly limited, and the photosensitive composition can be prepared by a known method. For example, the photosensitive composition can be prepared by mixing and stirring components at predetermined ratios according to an optional method to dissolve and/or disperse the components. For example, the photosensitive composition can also be prepared by previously dissolving or dispersing components in solvents, thus producing liquids, and thereafter mixing the liquids at predetermined ratios. The photosensitive composition prepared as described above can also be used after filtering using a filter having a pore diameter of 0.2 μm or the like, for example.

<Characteristics of Photosensitive Composition>
[Acid Value]

In the photosensitive composition of the present disclosure, the acid value based on the total solid content of the composition is preferably 100 mgKOH/g or less, more preferably 60 mgKOH/g or less, still more preferably 30 mgKOH/g or less, particularly preferably 5 mgKOH/g or less, and most preferably 1 mgKOH/g or less.

The lower limit of the acid value based on the total solid content of the composition is not particularly limited, and may be 0 mgKOH/g or more.

The acid value based on the total solid content of the photosensitive composition can be measured according to potentiometric titration based on JIS K2501 (2003) using a potential-difference automatic titration device (AT-510 manufactured by Kyoto Electronics Manufacturing Co., Ltd.), and a 0.1 mol/L sodium hydroxide/ethanol solution as a titration reagent.

(Method for Producing Cured Film)

The cured product of the present disclosure is a cured product prepared by curing the photosensitive composition of the present disclosure. The cured product of the present disclosure is preferably the cured film. The cured product of the present disclosure is preferably a cured film obtained by a method for producing the cured film of the present disclosure.

The method for producing the cured film of the present disclosure is not particularly limited as long as it is the method of curing the photosensitive composition of the present disclosure, thus producing the cured film. The method preferably includes the following steps a to d in this order:

the step a: an application step of applying the photosensitive composition of the present disclosure on a substrate;

the step b: a solvent removal step of removing a solvent from the applied photosensitive composition;

the step c: an exposure step of exposing at least a part of the photosensitive composition from which the solvent is removed to actinic radiation; and the step d: a heat treatment step of subjecting the photosensitive composition to a heat treatment.

The method for producing the cured film of the present disclosure preferably includes the following steps 1 to 5 in this order:

the step 1: an application step of applying the photosensitive composition of the present disclosure on a substrate;

the step 2: a solvent removal step of removing a solvent from the applied photosensitive composition;

the step 3: an exposure step of exposing at least a part of the photosensitive composition from which the solvent is removed to actinic radiation;

the step 4: a development step of developing the exposed photosensitive composition by an aqueous developing solution; and the step 5: a heat treatment step of subjecting the developed photosensitive composition to a heat treatment.

In the method for producing the cured film including the steps a to d, the development step is an optional step, and examples thereof include a case where patterning is not required such as a case where a protective film is provided over the surface of a substrate.

In the application step, the photosensitive composition of the present disclosure is preferably applied on the substrate to form a wetting film containing the solvent. The substrate can be washed by alkali washing and plasma washing before the photosensitive composition is applied to the substrate. Furthermore, after the substrate is washed, the surface of the substrate can be treated by hexamethyl disilazane or the like. The treatment tends to provide an improvement in the adhesion of the photosensitive composition to the substrate.

Examples of the substrate include an inorganic substrate, a resin, and a resin composite material.

Examples of the inorganic substrate include a glass, quartz, silicon, and silicon nitride substrates, and a composite substrate formed by vapor deposition of molybdenum, titanium, aluminum, or copper or the like on such a substrate.

Examples of the resin substrate include substrates made of synthetic resins such as polybutylene terephthalate, polyethylene terephthalate, polyethylene naphthalate, polybutylene naphthalate, polystyrene, polycarbonate, polysulfone, polyether sulfone, polyallylate, allyldiglycolcarbonate, polyamide, polyimide, polyamide-imide, polyetherimide, polybenzazole, polyphenylene sulfide, a polycycloolefin, a norbornene resin, a fluorine resin such as polychlorotrifluoroethylene, a liquid crystal polymer, an acrylic resin, an epoxy resin, a silicone resin, an ionomer resin, a cyanate resin, a crosslinked fumaric acid diester, a cyclic polyolefin, an aromatic ether, a maleimide-olefin copolymer, cellulose, and an episulfide resin. These substrates are not often used in their "as is" configuration, and are usually formed into a multilayer structure such as a TFT device according to the configuration of the final product.

In a case of a touch panel having an on-cell structure, or the like, the photosensitive composition of the present disclosure can also be applied on an LCD (liquid crystal display device) cell or an OLED (organic light emitting diode) cell that is once completed as a panel.

Since the photosensitive composition of the present disclosure has excellent adhesion to a metal film and a metal oxide that are formed by sputtering, the substrate preferably contains the metal film formed by sputtering. The metal is preferably titanium, copper, aluminum, indium, tin, manganese, nickel, cobalt, molybdenum, tungsten, chromium, silver, neodium, and oxides or alloys thereof, and more preferably molybdenum, titanium, aluminum, copper, and alloys thereof. The metals and the metal oxides may be used singly, or in combination of two or more kinds thereof.

A method of applying the photosensitive composition to the substrate is not particularly limited, and for example, there can be used methods such as a slit coating method, a spray method, a roll coating method, a spin coating method, a cast coating method, a slit-and-spin method, an inkjet method, and a printing method (flexographic, gravure, screen, or the like). The inkjet method and the printing method are preferable since a composition can be placed only in a necessary location, thus preventing the composition from being wasted.

The thickness of the wetting film when the composition is applied is not particularly limited. The composition can be applied at a film thickness that is suited for given purposes, and the film thickness is preferably in a range of from 0.05 to 10 μm.

Furthermore, before applying the photosensitive composition of the present disclosure to the substrate, a so-called pre-wetting method as described in JP-A 2009-145395 may be applied.

In the above solvent removal step, the solvent is preferably removed from the above applied film by means of pressure reduction (vacuum) and/or heating, or the like to thus form a dry coating on the substrate. Heating conditions in the solvent removal step are preferably from 70° C. to 130° C. and on the order of 30 to 300 seconds. It is not necessary to remove the solvent in the photosensitive composition completely in the above solvent removal step, and at least a part of the solvent may be removed.

The above application step and the above solvent removal step may be carried out in this order, at the same time, or repeatedly in turn. For example, the above solvent removal step may be carried out after inkjet applying is completely finished in the above application step, or the substrate may be heated and solvent removing may be carried out while discharging the photosensitive composition by means of an inkjet coating method in the above application step.

In the above exposure step, the obtained coating is preferably irradiated with actinic radiation having a wavelength of from 300 nm to 450 nm in predetermined pattern form.

As an exposure light source that can be used in the above exposure step, a low-pressure mercury lamp, a high pressure mercury lamp, an ultra high-pressure mercury lamp, a chemical lamp, an LED (light emitting diode) light source, an excimer laser generator, or the like may be used, and actinic radiation having a wavelength of from 300 nm to 450 nm such as i-line (365 nm), h-line (405 nm), or g-line (436 nm) may preferably be used. The irradiating light may be adjusted if necessary by way of a spectral filter such as a long wavelength cut filter, a short wavelength cut filter, or a band-pass filter.

As exposure equipment, various types of exposure equipment such as a mirror projection aligner, a stepper, a scanner, proximity, contact, a microlens array, a lens scanner, and laser exposure may be used.

As an exposure light source that can be used in the above exposure step, a low-pressure mercury lamp, a high pressure mercury lamp, an ultra high-pressure mercury lamp, a chemical lamp, an LED light source, or an excimer laser generator, or the like may be used, and actinic radiation having a wavelength of from 300 nm to 450 nm such as i-line (365 nm), h-line (405 nm), or g-line (436 nm) may preferably be used. The irradiating light may be adjusted if necessary by way of a spectral filter such as a long wavelength cut filter, a short wavelength cut filter, or a band-pass filter.

As exposure equipment, various types of exposure equipment such as a mirror projection aligner, a stepper, a scanner, proximity, contact, a microlens array, a lens scanner, or laser exposure may be used.

The amount of exposure in the above exposure step is not particularly limited, and is preferably from 1 to 3,000 mJ/cm$^2$, and more preferably from 1 to 500 mJ/cm$^2$.

Exposure in the above exposure step is preferably carried out in a state where there is an oxygen barrier from the viewpoint of curing acceleration. Examples of oxygen barrier means include exposing under an atmosphere of nitrogen and providing an oxygen barrier film.

Exposure in the above exposure step may be carried out for at least part of the photosensitive composition from which the solvent is removed, and for example it may be whole face exposure or pattern exposure.

It is also possible to carry out, after the above exposure step, a post-exposure heating treatment: Post Exposure Bake (hereinafter, also referred to as "PEB"). The temperature when PEB is carried out is preferably from 30° C. to 130° C., more preferably from 40° C. to 120° C., and particularly preferably from 50° C. to 110° C.

The heating method is not particularly limited, and a known method may be used. Examples thereof include a hotplate, an oven, and an infrared heater.

The heating time is preferably on the order of 1 minute to 30 minutes in the case of a hotplate, and preferably on the order of 20 minutes to 120 minutes in other cases. With this temperature range, it is possible to carry out heating without damaging the substrate or the equipment.

In the development step, the uncured photosensitive composition is developed and removed using an aqueous developing solution, to form a negative image. The developing solution used in the development step is preferably an alkaline aqueous developing solution.

The developing solution used in the development step preferably contains a basic compound. As the basic compound, an alkali metal hydroxide such as lithium hydroxide, sodium hydroxide, or potassium hydroxide; an alkali metal carbonate such as sodium carbonate, potassium carbonate, or cesium carbonate; an alkali metal bicarbonate such as sodium bicarbonate or potassium bicarbonate; a tetraalkylammonium hydroxide such as tetramethylammonium hydroxide, tetraethyl ammonium hydroxide, tetrapropylammonium hydroxide, tetrabutylammonium hydroxide, or diethyldimethylannmonium hydroxide; a (hydroxyalkyl)trialkylammonium hydroxide such as choline; a silicate such as sodium silicate or sodium metasilicate; an alkylamine such as ethylamine, propylamine, diethylamine, and triethylamine; an alcohol amine such as dimethyl ethanol amine or triethanol amine; and an alicyclic amine such as 1,8-diazabicyclo[5.4.0]-7-undecene, 1,5-diazabicyclo[4.3.0]-5-nonene may be used.

Among these, sodium hydroxide, potassium hydroxide, tetramethylammonium hydroxide, tetraethyl ammonium hydroxide, tetrapropylammonium hydroxide, tetrabutylammonium hydroxide, or colin(2-hydroxyethyltrimethylammonium hydroxide) is preferable.

It is also possible to use as the developing solution an aqueous solution obtained by adding an appropriate amount of a surfactant or a water-soluble organic solvent such as methanol or ethanol to the above aqueous solution of an alkali.

Preferable examples of the developing solution include a 0.4 to 2.5 mass % aqueous solution of tetramethylammonium hydroxide.

The pH of the developing solution is preferably from 10.0 to 14.0. The development time is preferably from 30 to 500 sec., and the method for development may be any of a liquid-puddle method (puddle method), a shower method, or a dip method, or the like.

A rinsing step may be carried out after development. In the rinsing step, removal of attached developing solution and removal of development residue are carried out by washing the substrate with pure water or the like after development. As a rinsing method, a known method may be used. Examples thereof include shower rinsing and dip rinsing.

With regard to pattern exposure and development, a known method and a known developing solution may be used. For example, a pattern exposure method and a development method described in JP-A Nos. 2011-186398 and 2013-83937 may suitably be used.

The method for producing the cured film of the present disclosure preferably includes a step (post bake) of subjecting the developed photosensitive composition to a heat treatment after the above development step. Carrying out the heat treatment after developing the photosensitive composition of the present disclosure enables a cured film having more excellent strength to be obtained.

The heat treatment temperature in the above heat treatment step is preferably 180° C. or less, more preferably 150° C. or less, and still more preferably 130° C. or less. The lower limit value is preferably 80° C. or more, and more preferably 90° C. or more. The heating method is not particularly limited, and a known method may be used. Examples include a hotplate, an oven, and an infrared heater.

The heating time is preferably on the order of 1 minute to 30 minutes in the case of a hotplate, and preferably on the order of 20 minutes to 120 minutes in other cases. With the above temperature range, it is possible to carry out curing without damaging the substrate or the equipment.

A heat treatment step may also be carried out after carrying out baking at a relatively low temperature prior to the heat treatment step (post-bake) (addition of a middle-bake step). When a middle-bake is carried out, it is preferable to carry out heating at 80° C. to 150° C. for 1 to 60 minutes, and thereafter carry out a heat treatment at 100° C. or more. It is also possible to carry out middle-bake heating and post-bake heating in multiple stages of three or more stages. Designing the middle-bake and post-bake in this way enables the shape of a pattern to be adjusted. The above heating may be carried out using a known heating method such as a hotplate, an oven, or an infrared heater.

It is preferable that the method further includes a post exposure step of irradiating the developed photosensitive composition with light before the heat treatment step after the development step from the viewpoint of an improvement in film hardness.

In the post exposure step, the entire surface of the developed photosensitive composition is preferably exposed. By carrying out the post bake after the post exposure, initiating species are generated from a photopolymerization initiator remaining in an exposed portion, and can be made to function as a catalyst for promoting a crosslinking step, thus promoting a film curing reaction. In the post exposure step, it is preferable to carry out energy exposure on the order of 50 to 3,000 mJ/cm$^2$ by a mercury lamp and an LED lamp or the like.

(Cured Film)

The cured film of the present disclosure is a cured film obtained by curing the photosensitive composition of the present disclosure.

The cured film of the present disclosure can be used suitably as an interlayer insulating film (insulating film) or an overcoat film (protective film), more suitably as an overcoat film for touch panels, and still more suitably as an overcoat film for on-cell structure touch panels. The on-cell structure touch panel and the on-cell type touch panel display device to be described later have the same meaning. The cured film of the present disclosure is preferably the cured film obtained by the method for producing the cured film of the present disclosure.

The photosensitive composition of the present disclosure provides a cured film having sufficient hardness even if the photosensitive composition is cured at low temperatures, for example, a cured film having hardness of H or more. Since a protective film formed by curing the photosensitive composition of the present disclosure has excellent cured film physical properties, the protective film is useful for the applications of an organic EL display device and liquid crystal display device.

Among these, the cured film of the present disclosure can be used suitably as a protective film for touch panel wirings, and more suitably as a protective film for wirings in the on-cell structure touch panel.

Since the photosensitive composition of the present disclosure has excellent curability and cured film properties, the photosensitive composition is used as a structure member of a device for MEMS (Micro Electro Mechanical Systems) in a state where a cured product and resist pattern obtained by curing the photosensitive composition of the present disclosure are used as a partition wall, or in a state where the cured product is incorporated as a part of a machine driving part. Examples of the device for MEMS include parts such as an SAW (Surface Acoustic Wave) filter, a BAW (Bulk Acoustic Wave) filter, a gyroscope sensor, a micro shutter for displays, an image sensor, electronic paper, an ink jet head, a biochip, and a sealant. More specific examples thereof include those described in JP-A No. 2007-522531, and JP-A Nos. 2008-250200 and 2009-263544.

Figure 2:
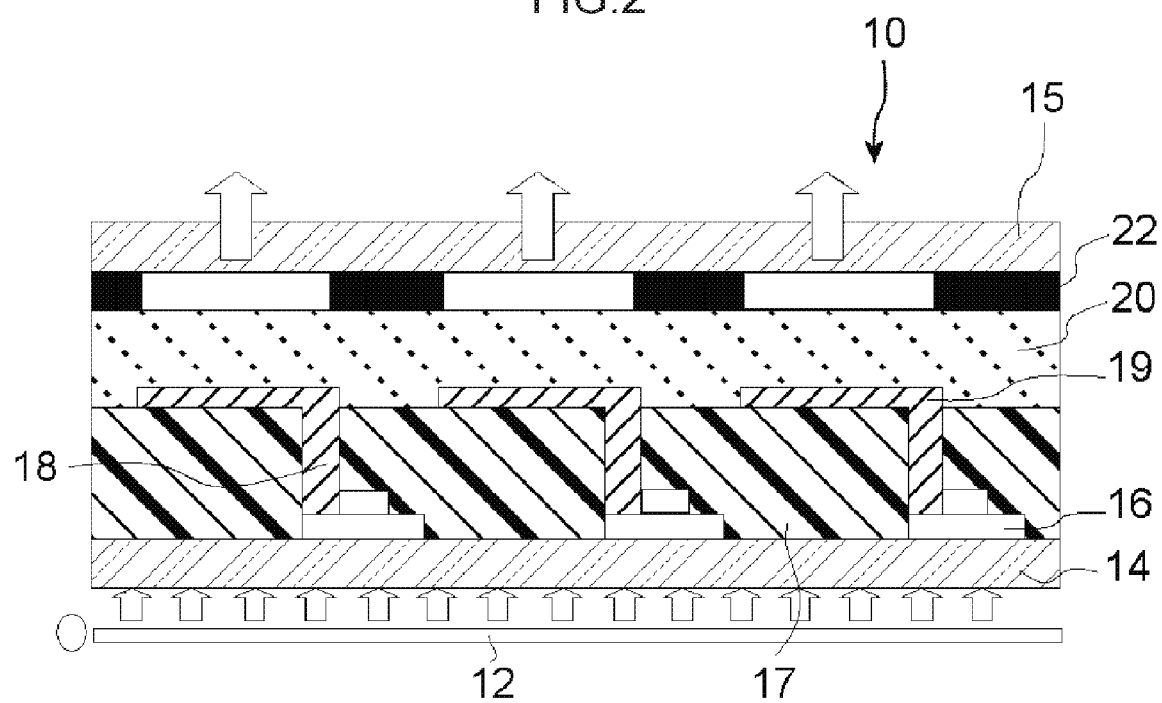
FIG. 2 is a schematic diagram of the constitution of one example of a liquid crystal display device, showing a schematic sectional view of an active matrix substrate in a liquid crystal display device, the substrate having a cured film 17, which is an interlayer insulating film.
Figure 3:
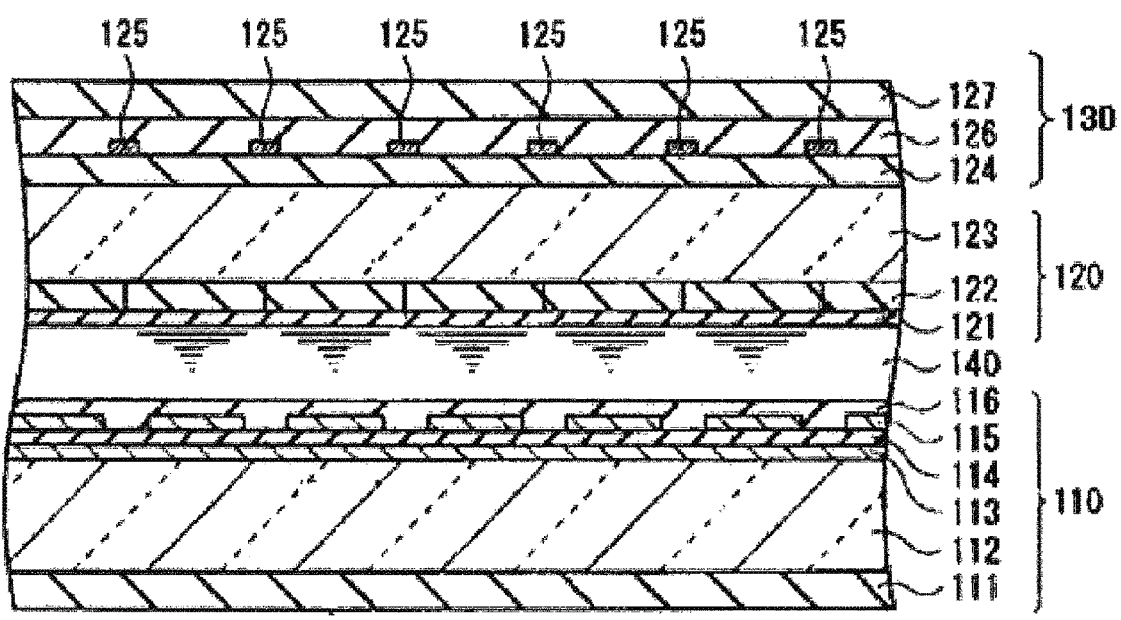
FIG. 3 is a schematic diagram of the constitution of one example of a liquid crystal display device having a function of a touch panel.

Since the photosensitive composition of the present disclosure has excellent flatness and transparency, for example, the photosensitive composition can also be used to form a bank layer (16) and a planarization film (57) that are described in FIG. 2 of JP-A No. 2011-107476, a partition wall (12) and a planarization film (102) that are described in FIG. 4A of JP-A No. 2010-9793, a bank layer (221) and a third interlayer insulating film (216b) that are described in FIG. 10 of JP-A No. 2010-27591, a second interlayer insulating film (125) and a third interlayer insulating film (126) that are described in FIG. 4A of JP-A No. 2009-128577, or a planarization film (12) and a pixel separation insulating film (14) that are described in FIG. 3 of JP-A No. 2010-182638. In addition, the photosensitive composition can be suitably used also for a spacer for maintaining a constant thickness of a liquid crystal layer in a liquid crystal display device, a color filter and a color filter protective film in the liquid crystal display device, a facsimile, an electronic copying machine, an imaging optics for an on-chip color filter such as a solid-state image sensing device, or a micro lens for an optical fiber connector.

(Display Device and Touch Panel)

A display device of the present disclosure has the cured film of the present disclosure.

Examples of the display device of the present disclosure include various display devices such as an organic EL display device, a liquid crystal display device, and a touch panel display device.

An organic EL display device of the present disclosure has the cured film of the present disclosure.

The organic EL display device of the present disclosure is not particularly limited as long as it has a planarization film or interlayer insulating film formed using the photosensitive composition of the present disclosure, and examples thereof include various types of known organic EL display devices and liquid crystal display devices having various structures.

For example, specific examples of a TFT (Thin-Film Transistor) included in the organic EL display device of the present disclosure include an amorphous silicon-TFT, a low-temperature polysilicon-TFT, and an oxide semiconductor TFT. Since the cured film of the present disclosure has excellent electrical properties, the cured film can be preferably used in combination with these TFTs.

FIG. 1 shows a schematic diagram of the constitution of one example of an organic EL display device. It shows a schematic sectional view of a substrate in a bottom emission type organic EL display device, and it has a planarization film 4.

A bottom gate type TFT 1 is formed on a glass substrate 6, and an insulating film 3 made of $Si_3N_4$ is formed so as to cover the TFT 1. After a contact hole, which is not illustrated in the figure, is formed in the insulating film 3, wiring 2 (height: 1.0 μm) is formed on the insulating film 3, the wiring 2 being connected to the TFT 1 via the contact hole. The wiring 2 is provided in order to provide a connection between the TFTs 1 or between the TFT 1 and an organic EL element formed in a subsequent step.

Furthermore, in order to planarize asperities due to formation of the wiring 2, a planarization film 4 is formed on the insulating film 3 so as to bury asperities due to the wiring 2.

A bottom emission type organic EL element is formed on the planarization film 4. That is, a first electrode 5 made of ITO is formed on the planarization film 4 so as to be connected to the wiring 2 via a contact hole 7. The first electrode 5 corresponds to a positive electrode of the organic EL element.

An insulating film 8 is formed in a shape that covers the periphery of the first electrode 5, and providing the insulating film 8 enables a short circuit between the first electrode 5 and a second electrode formed in a subsequent step to be prevented.

Furthermore, although not illustrated in FIG. 1, a positive hole transport layer, an organic light-emitting layer, and an electron transport layer may be provided in sequence by vapor deposition via desired pattern masks. A second electrode made of Al is subsequently formed on the entire surface above the substrate, and sealing is carried out by lamination using a sealing glass plate and a UV curing type epoxy resin, thus giving an active matrix type organic EL display device in which a TFT 1 is connected to each organic EL element in order to drive it.

A liquid crystal display device of the present disclosure has the cured film of the present disclosure.

The liquid crystal display device of the present disclosure is not particularly limited as long as it has an overcoat film (protective film), planarization film, or interlayer insulating film formed using the photosensitive composition of the present disclosure, and examples thereof include various types of known liquid crystal display devices having various structures.

Specific examples of a TFT (Thin-Film Transistor) included in the liquid crystal display device of the present disclosure include an amorphous silicon-TFT, a low-temperature polysilicon-TFT, and an oxide semiconductor TFT (for example, indium gallium zinc oxide, so-called IGZO). Since the cured film of the present disclosure has excellent electrical properties, the cured film can be preferably used in combination with these TFTs.

Examples of a liquid crystal driving type that can be taken by the liquid crystal display device of the present disclosure include a TN (Twisted Nematic) type, a VA (Vertical Alignment) type, an IPS (In-Plane-Switching) type, an FFS (Fringe Field Switching) type, and an OCB (Optically Compensated Bend) type.

In a panel constitution, the cured film of the present disclosure can be used also in a liquid crystal display device of a COA (Color Filter on Array) type. For example, the cured film can be used as an organic insulating film (115) of JP-A No. 2005-284291 and an organic insulating film (212) of JP-A No. 2005-346054. Specific examples of alignment types of a liquid crystal oriented film that can be taken by the liquid crystal display device of the present disclosure include a rubbing alignment method and a photo alignment method. Polymer alignment may be supported by PSA (Polymer Sustained Alignment) techniques described in JP-A Nos. 2003-149647 and 2011-257734.

The photosensitive composition of the present disclosure and the cured film of the present disclosure may be used, without being limited to the above applications, in various applications. For example, other than a planarization film and an interlayer insulating film, it may suitably be used for a spacer for maintaining a constant thickness of a protective film and liquid crystal layer in a liquid crystal display device, and for a micro lens provided on a color filter in a solid state image sensor, or the like.

FIG. 2 is a schematic sectional view showing one example of an active matrix type liquid crystal display device 10. The color liquid crystal display device 10 is a liquid crystal panel having a back light unit 12 on the reverse side, and the liquid crystal panel includes TFT 16 elements corresponding to all pixels disposed between two glass substrates 14 and 15 to which a polarizing film is affixed. Each element formed on the glass substrate has an ITO transparent electrode 19 wired thereto through a contact hole 18 formed in a cured film 17. The ITO transparent electrode 19 forms a pixel electrode. A liquid crystal 20 layer and an RGB color filter 22 having a black matrix disposed are provided above the ITO transparent electrode 19.

A light source for a back light is not particularly limited, and a known light source may be used. Examples thereof include a white LED, a multicolor LED such as a blue, red, or green LED, a fluorescent lamp (cold-cathode tube), and an organic EL.

The liquid crystal display device may be of a 3D (stereoscopic view) type or touch panel type (touch panel display device). The liquid crystal display device may also be of a flexible type. A second interlayer insulating film (48) described in JP-A No. 2011-145686 and an interlayer insulating film (520) described in JP-A No. 2009-258758 may be used.

The touch panel of the present disclosure is a touch panel including an insulating layer and/or a protective layer wholly or partially made of the cured product of the photosensitive composition of the present disclosure. The touch panel of the present disclosure preferably has at least a transparent substrate, an electrode, and an insulating layer and/or a protective layer.

The touch panel display device of the present disclosure is preferably a touch panel display device having the touch panel of the present disclosure. The touch panel of the present disclosure may be of any known type such as a resistive film type, a capacitance type, an ultrasonic type, or an electromagnetic induction type. Among these, a capacitance type is preferable.

Examples of the capacitance type touch panel include one disclosed in JP-A No. 2010-28115 and one disclosed in International Patent Laid-open No. 2012/057165.

Examples of the touch panel display device include a so-called in-cell type (for example, FIGS. 5, 6, 7, and 8 of JP-A No. 2012-517051), a so-called on-cell type (for example, FIG. 14 of JP-A No. 2012-43394, FIG. 2B of International Patent Laid-open No. 2012-141148), an OGS (One Glass Solution) type, a TOL (Touch on Lens) type, and other constitution (for example, FIG. 6 of JP-A No. 2013-164871).

FIG. 3 is a schematic diagram of the constitution of one example of the touch panel display device.

For example, the cured film of the present disclosure is suitably applied as a protective film between layers in FIG. 3, and also suitably applied as an interlayer insulating film for separating sensing electrodes of the touch panel. The sensing electrodes of the touch panel are preferably made of silver, copper, aluminum, titanium, molybdenum, and alloys thereof.

In FIG. 3, numeral number 110 designates a pixel substrate; 140, a liquid crystal layer; 120, a counter substrate; and 130, a sensor part. The pixel substrate 110 has a polarizing plate 111, a transparent substrate 112, a common electrode 113, an insulating layer 114, a pixel electrode 115, and an oriented film 116 that are sequentially provided from a lower side in FIG. 3. The counter substrate 120 has an oriented film 121, a color filter 122, and a transparent substrate 123 that are sequentially provided from a lower side in FIG. 3. The sensor part 130 has a phase difference film 124, an adhesion layer 126, and a polarizing plate 127. In FIG. 3, numeral number 125 designates a sensing electrode for sensors. The cured film of the present disclosure can be used for an insulating layer (114) of a pixel substrate portion (also referred to as an interlayer insulating film), various protective films (not shown), various protective films (not shown) of a pixel substrate portion, various protective films (not shown) of a counter substrate portion, and various protective films (not shown) of a sensor portion, or the like.

Furthermore, a static driving type liquid crystal display device to which the present disclosure is applied can also display a pattern having high design properties. As an example, the present disclosure can be applied as an insulating film for a polymer network type liquid crystal as described in JP-A No. 2001-125086.

Figure 4:
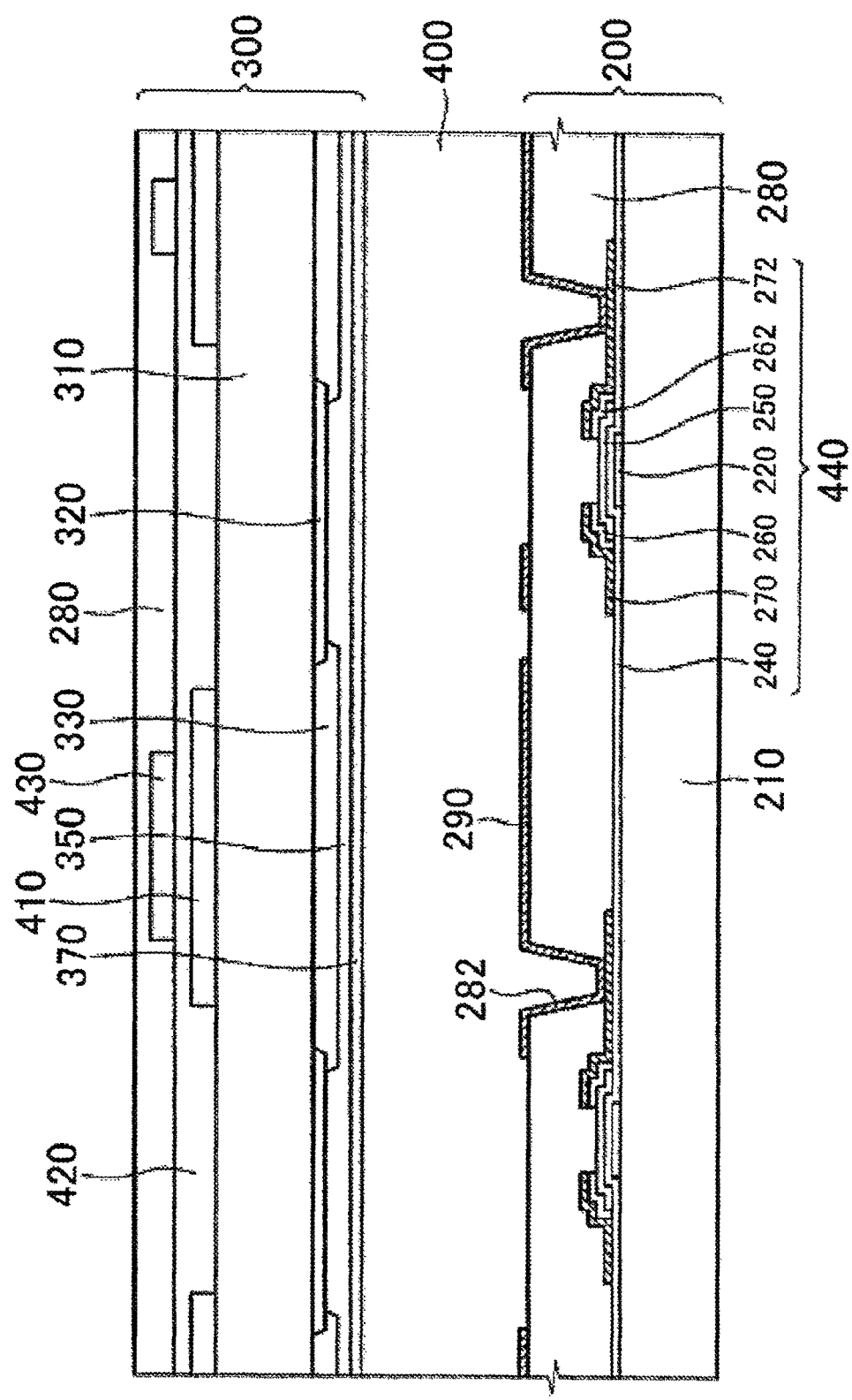
FIG. 4 is a schematic diagram of the constitution of another example of a liquid crystal display device having a function of a touch panel.

FIG. 4 is a schematic diagram of the constitution of another example of the touch panel display device.

The touch panel display device includes a lower display plate 200, an upper display board 300, and a liquid crystal layer 400. The lower display plate 200 corresponds to a thin film transistor display board including a thin film transistor (TFT) 440. The upper display board 300 is opposed to the lower display plate 200, and corresponds to a color filter display board including a plurality of color filters 330 provided on a surface opposed to the lower display plate 200. The liquid crystal layer 400 is formed between the lower display plate 200 and the upper display board 300. The liquid crystal layer 400 contains liquid crystal molecules (not shown).

The lower display plate 200 can include a first insulating substrate 210, a thin film transistor (TFT) disposed on the first insulating substrate 210, an insulating film 280 formed on the upper surface of the thin film transistor (TFT), and a pixel electrode 290 disposed on the insulating film 280. The thin film transistor (TFT) can include a gate electrode 220, a gate insulating film 240 covering the gate electrode 220, a semiconductor layer 250, an ohmic contact layers 260 and 262, a source electrode 270, and a drain electrode 272. A contact hole 282 is formed in the insulating film 280 so that the drain electrode 272 of the thin film transistor (TFT) is exposed.

The upper display board 300 includes a light shielding member 320 disposed on a surface of a second insulating substrate 310 and arranged in a matrix form, an oriented film 350 disposed on the second insulating substrate 310, a color filter 330 disposed on the oriented film, and a common electrode 370 disposed on the color filter 330 and applying a voltage to the liquid crystal layer 400 so as to correspond to the pixel electrode 290 of the lower display plate 200.

In the touch panel display device shown in FIG. 4, a sensing electrode 410, an insulating film 420, a driving electrode 430, and an insulating film (protective film) 280 are disposed on the other surface of the second insulating substrate 310. Thus, when the upper display board 300 is formed in the manufacture of the liquid crystal display device shown in FIG. 4, the sensing electrode 410, the insulating film 420, and the driving electrode 430 or the like that are constituent elements of a touch screen can be formed together. Particularly, the cured film obtained by curing the photosensitive composition of the present disclosure can be suitably used for the insulating film 280 and the insulating film 420.

EXAMPLES

The embodiments of the present invention will be further specifically described by reference to the following Examples. The materials, amount of material used, proportions, processing details, and treatment procedure or the like shown in the Examples below may be modified if appropriate as long as the modifications do not depart from the spirit and scope of the present disclosure. Therefore, the scope of the present disclosure should not be construed as being limited to the specific Examples shown below. In addition, "parts" and "%" are on a mass basis unless otherwise specified.

Hereinafter, the details of abbreviations used in Examples are as follows.

<Compound Having Two or More Ethylenically Unsaturated Groups>

DPHA: dipentaerythritol hexaacrylate, manufactured by Nippon Kayaku Co., Ltd., hexafunctional A-TMMT: pentaerythritol tetraacrylate, manufactured by Shin-Nakamura Chemical Co., Ltd., tetrafunctional M309: trimethylolpropane triacrylate, manufactured by Toagosei Co., Ltd., pentafunctional M-510: ARONIX M-510, manufactured by Toagosei Co., Ltd., trifunctional M-520: ARONIX M-520, manufactured by Toagosei Co., Ltd., pentafunctional A-NOD-N: 1,9-nonanedioldiacrylate, manufactured by Shin-Nakamura Chemical Co., Ltd., difunctional A-1: the following synthetic product A-1, acrylic copolymer A-2: the following synthetic product A-2

M-5300: ARONIX M-5300, manufactured by Toagosei Co., Ltd., monofunctional, Comparative Example <Photopolymerization Initiator>

B-1: compound represented by the following Formula B-1, oxime ester compound, synthesized by a method described in paragraphs 0368 to 0374 of JP-A No. 2013-249471

B-2: Irgacure OXE-01, oxime ester compound, manufactured by BASF

B-3: Irgacure OXE-02, oxime ester compound, manufactured by BASF

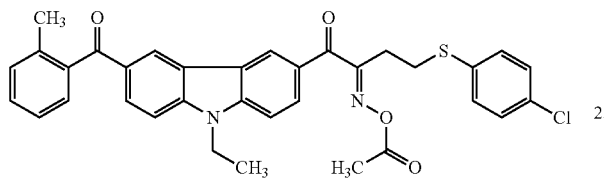

B-1

<Polymer A1>

SMA-3000P: styrene-maleic acid anhydride copolymer a1:a2=3:1, Mw=9,500, manufactured by CrayValley SMA-EF-40: styrene-maleic acid anhydride copolymer a1:a2=4:1, Mw=10,500, manufactured by CrayValley SMA-EF-60: styrene-maleic acid anhydride copolymer a1:a2=6:1, Mw=11,500, manufactured by CrayValley C-1: the following synthetic product C-1, a1:a2=3:1

C-2: the following synthetic product C-2, a1:a2=4:1

C-3: the following synthetic product C-3, a1:a2=5:1

SMA-1000P: styrene-maleic acid anhydride copolymer, a1:a2=1:1, Mw=5,500, manufactured by CrayValley, Comparative Example SMA-2000P: styrene-maleic acid anhydride copolymer, a1:a2=2:1, Mw=7,500, manufactured by CrayValley, Comparative Example SMA-EF-80: styrene-maleic acid anhydride copolymer, a1:a2=8:1, Mw=14,400, manufactured by CrayValley, Comparative Example SMA-2625: half ester compound of styrene-maleic acid anhydride copolymer, a1:a2=2:1, Mw=9,000, CrayValley, Comparative Example SMA-17352: half ester compound of styrene-maleic acid anhydride copolymer, a1:a2=1:1, Mw=7,000, manufactured by CrayValley, Comparative Example Polystyrene: weight average molecular weight 35,000, manufactured by Sigma-Aldrich, Comparative Example <Particles>

PMA-ST: silica particles, manufactured by Nissan Chemical Industries, Ltd., number average primary particle size from 10 to 15 nm MIBK-ST-L: organosilica sol, manufactured by Nissan Chemical Industries, Ltd., number average primary particle size from 40 to 50 nm E-3: TTO-51, titanium oxide, manufactured by Ishihara Sangyo Kaisha, Ltd., number average primary particle size 20 nm E-4: silver nanoparticles, manufactured by Adachi New industrial Companies, number average primary particle size 200 nm E-5: Chemisnow MP-1451, polymer cross-linking particles, manufactured by Soken Chemical & Engineering Co., Ltd., number average primary particle size 0.15 μm E-6: Particles E-6 prepared by the following preparing method, number average primary particle size 300 nm <Polymerization Inhibitor>

Phenothiazine: phenothiazine (manufactured by Seiko Chemical Co., Ltd.)

Phenoxazine: phenoxazine (manufactured by Tokyo Kasei Kogyo Co., Ltd.)

<Alkoxysilane Compound>

KBM-5103: 3-acryloxyprophyltrimethoxysilane, manufactured by Shin-Etsu Chemical Co., Ltd.

KBM-403: 3-glycidoxypropyltrimethoxysilane, structure shown in the following, manufactured by Shin-Etsu Chemical Co., Ltd.

<Surfactant>

W-1: Megafac F-554, 2% PGMEA solution of perfluoroalkyl group-containing nonionic surfactant, manufactured by DIC W-2: Megafac F-552, fluorine-based oligomer type surfactant, manufactured by DIC <Synthesis of A-1>

A mixed solution of methacrylic acid (86.1 parts by mass (1.0 mol molar equivalents)) and diethylene glycol ethyl methyl ether (99.9 parts by mass) was heated to 70° C. under a flow of nitrogen. The mixed solution was added dropwise over 2.5 hours to a mixed solution of V-65 radical polymerization initiator (manufactured by Wako Pure Chemical Industries, Ltd., 4.5 parts by mass) and diethylene glycol ethyl methyl ether (90.0 parts by mass) while stirring. After the dropwise addition was completed, a reaction was carried out at 70° C. for 5 hours, thus giving a diethylene glycol ethyl methyl ether solution (solid content concentration: 40 mass %) as a binder a-1.

To the above a-1 binder solution, glycidyl methacrylate (113.7 parts by mass (0.8 molar equivalents)), benzyltriethylammonium (4.82 mass), and diethylene glycol ethyl methyl ether (85.3 mass) were further added, and a reaction was carried out at 75° C., thus giving a diethylene glycol ethyl methyl ether solution (solid content concentration: 40 mass %) as A-1. The weight average molecular weight measured by the gel permeation chromatography (GPC) of the obtained A-1 was 20,000.

<Synthesis of A-2>

50.4 parts of a hexamethylene diisocyanate trimer (manufactured by Asahi Chemical Co., Ltd., TPA-100) and 157.4 parts of dipentaerythritol pentaacrylate (a product manufactured by Aldrich was subjected to column refining for use) were mixed in a toluene solvent, and 0.2 parts of U-CAT SA 102 (manufactured by San-Apro Ltd.) as a curing catalyst was added to the mixture. These were heated at 60° C. under a flow of nitrogen for 6 hours.

After standing to cool, the reaction mixture was refined by silica gel column chromatography, and divided, thus giving A-2.

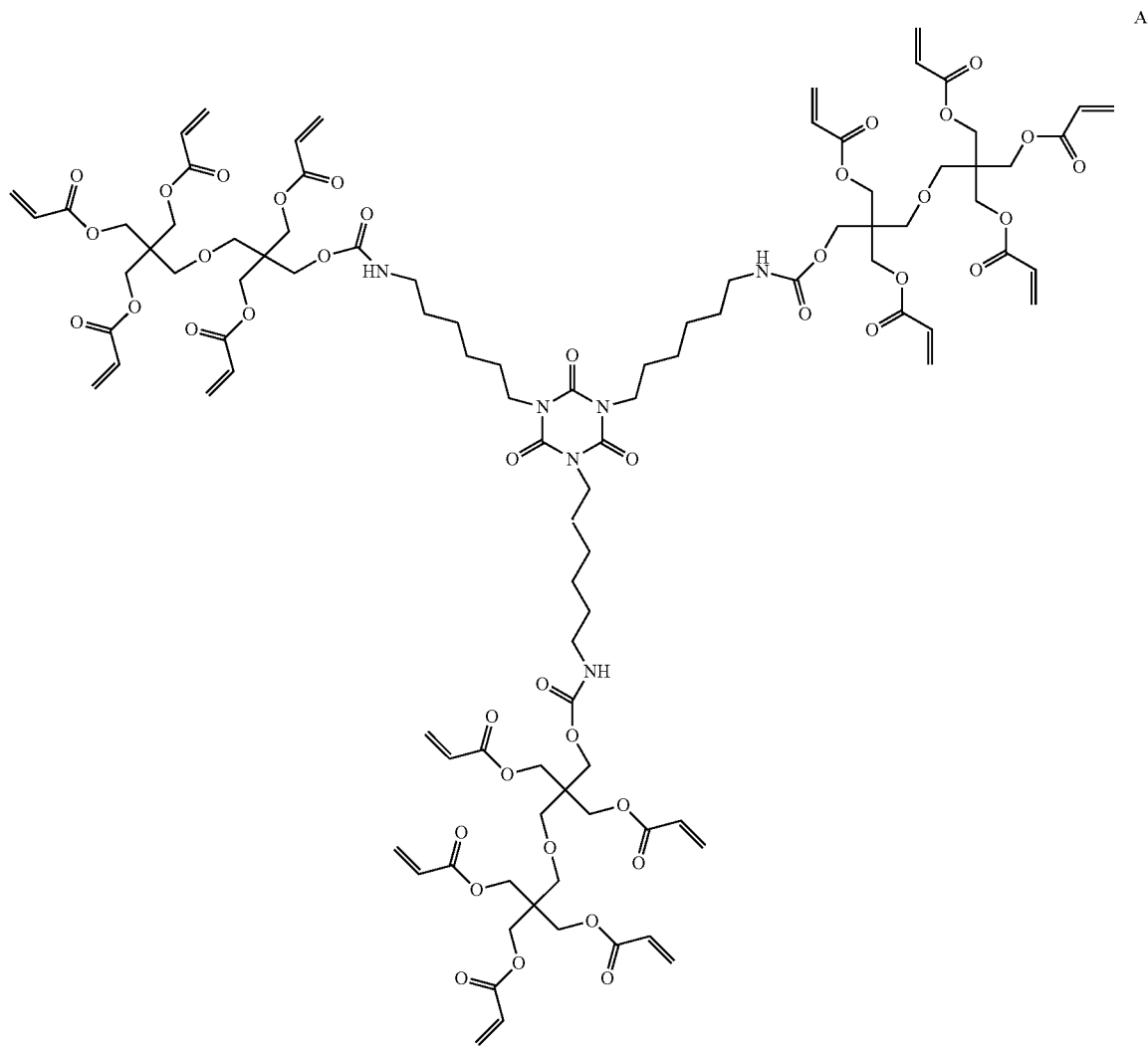

A-2

<Synthesis of C-1>

Propylene glycol monomethyl ether acetate (119.9 g) was introduced into a three-necked flask, and heated to 85° C. under a flow of nitrogen. A solution as a dropping liquid 1 was prepared, which contained methacrylic acid (22.3 g: amount of 11.2 mass % in the total monomer components), methyl methacrylate (41.8 g: amount of 20.9 mass % in the total monomer components), styrene (99.9 g: equivalent to 50.0 mass % in the total monomer components), V-601 (11.17 g) (manufactured by Wako Pure Chemical Industries, Ltd.), 4-methoxy phenol (0.01 g), and propylene glycol monomethyl ether acetate (15.0 g). A solution as a dropping liquid 2 was prepared, which contained itaconic anhydride (35.8 g: equivalent to 17.9 mass % in the total monomer components), propylene glycol monomethyl ether acetate (236.3 g), and 4-methoxy phenol (0.01 g).

Into the solution in the three-necked flask maintained at 85° C.±1° C., the dropping liquid 1 was added dropwise over 2 hours, and the dropping liquid 2 was added dropwise over 2 hours and 15 minutes after 15 minutes from the dropping start of the dropping liquid 1.

After stirring at 85° C.±1° C. for 1 hour and 30 minutes after the dropping of the dropping liquid 2 was completed, V-601 (4.50 g) was added, and these solutions were stirred at 85° C.±1° C. for 4 hours. The resultant mixture was cooled to room temperature, thus giving a polymer C-1 (solid content concentration: 35.0 mass %, Mw=13,000).

<Synthesis of C-2>

A polymer C-2 (solid content concentration: 35.0 mass %, Mw=12,000) was obtained in the same manner as in the polymer C-1 except that the amount of styrene used, the amount of methyl methacrylate used, and the amount of itaconic anhydride used were respectively changed to 124.9 g, 19.0 g, and 33.6 g.

<Synthesis of C-3>

A polymer C-3 (solid content concentration: 35.0 mass %, Mw=11,200) was obtained in the same manner as in the polymer C-1 except that the amount of methacrylic acid used, the amount of styrene used, the amount of methyl methacrylate used, and the amount of itaconic anhydride used were respectively changed to 17.2 g, 145.7 g, 5.6 g, and 31.4 g.

<Manufacture of E-6>

480 parts by mass of methanol was added to 100 parts by mass of SEAHOSTAR KE-P30 (amorphous silica particles, manufactured by Nippon Shokubai Co., Ltd., average particle size: 0.3 μm), and these were stirred in a mixing tank, thus giving a silica dispersion liquid of 20 mass.

Furthermore, 20 parts by mass of acryloyloxypropyl trimethoxysilane and 1.5 parts by mass of diisopropoxy aluminum ethyl acetate were added to the silica dispersion liquid, followed by mixing and adding 9 parts by mass of ion exchange water. The resultant solution was reacted at 60° C. for 8 hours, and then cooled to room temperature. 1.8 parts by mass of acetylacetone was added to the solution. The solvent was substituted by distillation under reduced pressure while methyl ethyl ketone was added so that the total liquid amount was almost constant.

The solid content was finally adjusted to 20 mass %, thus preparing a dispersion liquid E-6.

Examples 1 to 44 and Comparative Examples 1 to 10

<Preparation of Photosensitive Composition>

Components described in the following Tables 1 and 2 and propylene glycol monomethyl ether acetate (PGMEA) as a solvent were blended and stirred, thus producing solvent solutions and/or dispersion liquids. The solvent solutions and/or the dispersion liquids were filtered with a polytetrafluoroethylene filter having a pore diameter of 0.3 μm, thus giving photosensitive compositions of Examples 1 to 44 and Comparative Examples 1 to 10. The amount blended of PGMEA was adjusted so that the amount of the solid content of each of the photosensitive compositions was set to 20%.

The unit of the amount of addition of each of the components of the following Tables 1 and 2 is parts by mass.

Examples described as "-" in the "kind" column of each of the components in Tables mean uncontaining the corresponding component.

In the "a1:a2" column in the "polymer A1" column, "molar content ratio of constitutional unit a1 to constitutional unit a2 in polymer A1" is described, and in the "acid anhydride value (mmol/g)" column, the acid anhydride value of the polymer A1 measured by the above-mentioned method is described.

When the polymer did not contain the constitutional unit a1 and/or the constitutional unit a2, "–" was described in the "a1:a2" column.

The following evaluations were performed using the obtained photosensitive compositions. The evaluation results are shown in Table 3.

An acid value based on the total solid content was measured for each of the photosensitive compositions, and described in the "acid value (mgKOH/g) in each of photosensitive compositions" column. The measurement of the acid value was carried out by the above-mentioned method. Examples described as "<1.0" in the "acid value (mgKOH/g) in each of photosensitive compositions" column show that the acid value of the photosensitive composition based on the total solid content is less than 1.0 mgKOH/g.

<Evaluation of Perspiration Resistance>

Each of the photosensitive compositions was spin-coated on a copper substrate subjected to sputtering film formation, and prebaked at 90° C. for 120 seconds, thus giving a coating film having a film thickness of 2.0 μm.

Next, light irradiation of 500 mJ/cm$^2$ (in terms of i-line) was carried out by a high-pressure mercury lamp. Furthermore, a bake was carried out at 120° C. for 60 minutes in an oven, to produce a cured film, thus giving a sample for evaluation of resistance to artificial sweat solution.

Subsequently, acid artificial sweat was produced with reference to JIS standards (JIS L0848). 30 μl of the artificial sweat was added dropwise to the surface of the evaluation sample, and the sweat was then naturally dried over 24 hours.

The dried sample for evaluation was left to stand under high temperature and high humidity (85° C., RH85%) for 72 hours.

With respect to copper corrosion, the corrosion concentrically advances around a point at which the sweat is added dropwise and dried. The surface state of the substrate for evaluation was observed, and the corrosion distance advancing from the center was measured. The sample for evaluation was evaluated according to the following marks.

The marks 3, 4, and 5 are at practical level; the mark 4 or 5 is preferable; and the mark 5 is more preferable.

5: The surface of the protective film is not changed at all.
4: Very few traces are visible on the surface of the protective film, and the corrosion distance is 0.5 mm or less.
3: Traces are visible on the surface of the protective film, and the corrosion distance is from 0.5 mm to 10 mm.
2: Traces in which copper is slightly discolored to blue are present on the surface of the protective film, and the corrosion distance is from 10 mm to 20 mm.
1: Traces in which copper is drastically discolored to blue are present on the surface of the protective film, and the corrosion distance is 20 mm or more.

<Evaluation of Footing>

Each of the photosensitive compositions was applied on a glass substrate (EAGLE XG 0.7 mm thickness (manufactured by Corning, Inc.)) by spin-coating, and then prebaked on a hot plate at 90° C. for 120 sec., to volatilize a solvent, thus forming a photosensitive composition layer having a film thickness of 2.0 μm.

Next, the obtained photosensitive composition layer was exposed in such an exposure amount that a 40 μm line-and-space pattern (L/S=1/1) was exactly set to 40 μm in a bottom size via a predetermined mask using an ultra high-pressure mercury lamp.

The photosensitive composition layer after exposure was developed with an alkali developing solution (2.38% tetramethylammonium hydroxide aqueous solution) at 23° C. for 60 seconds, and then rinsed with ultrapure water for 20 seconds.

In a patterning substrate obtained by these operations, the section of a contact hole pattern was observed using a scanning electron microscope, and a taper length from the position of the half of the observed film thickness was evaluated as footing. The evaluation standards are as follows: the marks 3, 4, and 5 are at practical level; the mark 4 or 5 is preferable; and the mark 5 is more preferable.

The evaluation standards are as follows.
5: The footing length is less than 1 μm.
4: The footing length is from 1 μm to less than 2 μm.
3: The footing length is from 2 μm to less than 3 μm.
2: The footing length is from 3 μm to less than 5 μm.
1: The footing length is 5 μm or more.

<Evaluation of Pencil Hardness>

Each of the photosensitive compositions prepared by the above-mentioned method was spin-coated on a glass substrate, and prebaked at 90° C. for 120 seconds, thus giving a coating film having a film thickness of 2.0 Next, light irradiation of 500 mJ/cm$^2$ (in terms of i-line) was carried out by a high-pressure mercury lamp. Furthermore, a bake was carried out at 120° C. for 60 minutes using an oven, thus producing a cured film.

The obtained cured film was subjected to a pencil hardness test according to the method (load: 750 g) based on JIS K5600: 1999, thus evaluating film hardness. The film hardness of 4H or more is a practical range, and the film hardness is preferably 5H or more, and more preferably 6H or more.

<Evaluation of Transmittance>

Each of the prepared photosensitive compositions was spin-coated on a glass substrate, and prebaked at 90° C. for 120 seconds, thus giving a coating film having a film thickness of 2.0 Next, light irradiation of 500 mJ/cm$^2$ (in terms of i-line) was carried out by a high-pressure mercury lamp. Furthermore, a bake was carried out at 120° C. for 60 minutes using an oven, thus producing a cured film.

The total light transmittance of the obtained cured film can be measured using Hayes meter NDH7000 (manufactured by Nippon Denshoku Industries Co., Ltd.). As the above transmittance is higher, it can be said that the cured film has excellent transparency.

The marks 3, 4, and 5 are at practical level; the mark 4 or 5 is preferable; and the mark 5 is more preferable.

The evaluation standards are as follows.

5: The total light transmittance is 98% or more.
4: The total light transmittance is from 95% to less than 98%.
3: The total light transmittance is from 90% to less than 95%.
2: The total light transmittance is from 80% to less than 90%.
1: The total light transmittance is less than 80%.

TABLE 1

| | | Compound having two or more ethylenically unsaturated groups | | Photopolymerization initiator | | Polymer A1 | | | Particles | |
|---|---|---|---|---|---|---|---|---|---|---|
| | | Kind | Amount of addition | Kind | Amount of addition | Kind | a1:a2 | Acid anhydride value (mmol/g) | Amount of addition | Kind |
| Examples | 1 | DPHA | 60 | B-1 | 2 | SMA-3000P | 3:1 | 2.54 | 5 | PMA-ST |
| | 2 | DPHA | 60 | B-1 | 2 | SMA EF-40 | 4:1 | 2.04 | 5 | PMA-ST |
| | 3 | DPHA | 60 | B-1 | 2 | SMA EF-60 | 6:1 | 1.48 | 5 | PMA-ST |
| | 4 | DPHA | 60 | B-1 | 2 | SMA EF-60 | 6:1 | 2.01 | 2.5 | PMA-ST |
| | | | | | | SMA-3000P | 3:1 | | 2.5 | |
| | 5 | DPHA | 60 | B-1 | 2 | C-1 | 3:1 | 1.60 | 5 | PMA-ST |
| | 6 | DPHA | 60 | B-1 | 2 | C-2 | 4:1 | 1.50 | 5 | PMA-ST |
| | 7 | DPHA | 60 | B-1 | 2 | C-3 | 5:1 | 1.40 | 5 | PMA-ST |
| | 8 | DPHA | 60 | B-1 | 2 | SMA-3000P | 3:1 | 2.54 | 0.5 | PMA-ST |
| | 9 | DPHA | 60 | B-1 | 2 | SMA-3000P | 3:1 | 2.54 | 3 | PMA-ST |
| | 10 | DPHA | 60 | B-1 | 2 | SMA-3000P | 3:1 | 2.54 | 8 | PMA-ST |
| | 11 | DPHA | 60 | B-1 | 2 | SMA-3000P | 3:1 | 2.54 | 5 | MIBK-ST-L |
| | 12 | DPHA | 60 | B-1 | 2 | SMA-3000P | 3:1 | 2.54 | 5 | E-3 |
| | 13 | DPHA | 60 | B-1 | 2 | SMA-3000P | 3:1 | 2.54 | 5 | E-4 |
| | 14 | DPHA | 60 | B-1 | 2 | SMA-3000P | 3:1 | 2.54 | 5 | E-5 |
| | 15 | DPHA | 60 | B-1 | 2 | SMA-3000P | 3:1 | 2.54 | 5 | PMA-ST |
| | 16 | DPHA | 60 | B-1 | 2 | SMA-3000P | 3:1 | 2.54 | 5 | PMA-ST |
| | 17 | DPHA | 60 | B-1 | 2 | SMA-3000P | 3:1 | 2.54 | 5 | PMA-ST |
| | 18 | DPHA | 60 | B-1 | 2 | SMA-3000P | 3:1 | 2.54 | 5 | PMA-ST |
| | 19 | DPHA | 60 | B-2 | 2 | SMA-3000P | 3:1 | 2.54 | 5 | PMA-ST |
| | 20 | DPHA | 60 | B-3 | 2 | SMA-3000P | 3:1 | 2.54 | 5 | PMA-ST |
| | 21 | A-TMMT | 60 | B-1 | 2 | SMA-3000P | 3:1 | 2.54 | 5 | PMA-ST |
| | 22 | M309 | 60 | B-1 | 2 | SMA-3000P | 3:1 | 2.54 | 5 | PMA-ST |
| | 23 | A-2 | 60 | B-1 | 2 | SMA-3000P | 3:1 | 2.54 | 5 | PMA-ST |
| | 24 | M-510 | 60 | B-1 | 2 | SMA-3000P | 3:1 | 2.54 | 5 | PMA-ST |
| | 25 | M-520 | 60 | B-1 | 2 | SMA-3000P | 3:1 | 2.54 | 5 | PMA-ST |
| | 26 | A-NOD-N | 60 | B-1 | 2 | SMA-3000P | 3:1 | 2.54 | 5 | PMA-ST |
| | 27 | DPHA | 30 | B-1 | 2 | SMA-3000P | 3:1 | 2.54 | 5 | PMA-ST |
| | | A-1 | 30 | | | | | | | |

| | | Particles | Polymerization inhibitor | | Alkoxysilane compound | | Surfactant | |
|---|---|---|---|---|---|---|---|---|
| | | Number average primary particle size (nm) | Amount of addition | Kind | Amount of addition | Kind | Amount of addition | Kind | Amount of addition |
| Examples | 1 | 10-15 | 30 | Phenothiazine | 0.2 | KBM-5103 | 10 | W-1 | 0.1 |
| | 2 | 10-15 | 30 | Phenothiazine | 0.2 | KBM-5103 | 10 | W-1 | 0.1 |
| | 3 | 10-15 | 30 | Phenothiazine | 0.2 | KBM-5103 | 10 | W-1 | 0.1 |
| | 4 | 10-15 | 30 | Phenothiazine | 0.2 | KBM-5103 | 10 | W-1 | 0.1 |
| | 5 | 10-15 | 30 | Phenothiazine | 0.2 | KBM-5103 | 10 | W-1 | 0.1 |
| | 6 | 10-15 | 30 | Phenothiazine | 0.2 | KBM-5103 | 10 | W-1 | 0.1 |
| | 7 | 10-15 | 30 | Phenothiazine | 0.2 | KBM-5103 | 10 | W-1 | 0.1 |
| | 8 | 10-15 | 30 | Phenothiazine | 0.2 | KBM-5103 | 10 | W-1 | 0.1 |
| | 9 | 10-15 | 30 | Phenothiazine | 0.2 | KBM-5103 | 10 | W-1 | 0.1 |
| | 10 | 10-15 | 30 | Phenothiazine | 0.2 | KBM-5103 | 10 | W-1 | 0.1 |
| | 11 | 40-50 | 30 | Phenothiazine | 0.2 | KBM-5103 | 10 | W-1 | 0.1 |
| | 12 | 20 | 30 | Phenothiazine | 0.2 | KBM-5103 | 10 | W-1 | 0.1 |
| | 13 | 200 | 30 | Phenothiazine | 0.2 | KBM-5103 | 10 | W-1 | 0.1 |
| | 14 | 150 | 30 | Phenothiazine | 0.2 | KBM-5103 | 10 | W-1 | 0.1 |

TABLE 1-continued

| | | | | | | | | | |
|---|---|---|---|---|---|---|---|---|---|
| 15 | 10-15 | 10 | Phenothiazine | 0.2 | KBM-5103 | 10 | W-1 | 0.1 |
| 16 | 10-15 | 20 | Phenothiazine | 0.2 | KBM-5103 | 10 | W-1 | 0.1 |
| 17 | 10-15 | 30 | Phenothiazine | 0.2 | KBM-5103 | 10 | W-1 | 0.1 |
| 18 | 10-15 | 40 | Phenothiazine | 0.2 | KBM-5103 | 10 | W-1 | 0.1 |
| 19 | 10-15 | 30 | Phenothiazine | 0.2 | KBM-5103 | 10 | W-1 | 0.1 |
| 20 | 10-15 | 30 | Phenothiazine | 0.2 | KBM-5103 | 10 | W-1 | 0.1 |
| 21 | 10-15 | 30 | Phenothiazine | 0.2 | KBM-5103 | 10 | W-1 | 0.1 |
| 22 | 10-15 | 30 | Phenothiazine | 0.2 | KBM-5103 | 10 | W-1 | 0.1 |
| 23 | 10-15 | 30 | Phenothiazine | 0.2 | KBM-5103 | 10 | W-1 | 0.1 |
| 24 | 10-15 | 30 | Phenothiazine | 0.2 | KBM-5103 | 10 | W-1 | 0.1 |
| 25 | 10-15 | 30 | Phenothiazine | 0.2 | KBM-5103 | 10 | W-1 | 0.1 |
| 26 | 10-15 | 30 | Phenothiazine | 0.2 | KBM-5103 | 10 | W-1 | 0.1 |
| 27 | 10-15 | 30 | Phenothiazine | 0.2 | KBM-5103 | 10 | W-1 | 0.1 |

TABLE 2

| | | Compound having two or more ethylenically unsaturated groups | | Photopolymerization initiator | | Polymer A1 | | | | Particles |
|---|---|---|---|---|---|---|---|---|---|---|
| | | Kind | Amount of addition | Kind | Amount of addition | Kind | a1:a2 | Acid anhydride value (mmol/g) | Amount of addition | Kind |
| Examples | 28 | DPHA<br>A-1 | 50<br>10 | B-1 | 2 | SMA-3000P | 3:1 | 2.54 | 5 | PMA-ST |
| | 29 | DPHA | 30 | B-1 | 2 | SMA-3000P | 3:1 | 2.54 | 5 | PMA-ST |
| | 30 | DPHA | 45 | B-1 | 2 | SMA-3000P | 3:1 | 2.54 | 5 | PMA-ST |
| | 31 | DPHA | 60 | B-1 | 2 | SMA-3000P | 3:1 | 2.54 | 5 | PMA-ST |
| | 32 | DPHA | 70 | B-1 | 2 | SMA-3000P | 3:1 | 2.54 | 5 | PMA-ST |
| | 33 | DPHA | 60 | B-1 | 2 | SMA-3000P | 3:1 | 2.54 | 5 | PMA-ST |
| | 34 | DPHA | 60 | B-1 | 2 | SMA-3000P | 3:1 | 2.54 | 5 | PMA-ST |
| | 35 | DPHA | 60 | B-1 | 2 | SMA-3000P | 3:1 | 2.54 | 5 | PMA-ST |
| | 36 | DPHA | 60 | B-1 | 2 | SMA-3000P | 3:1 | 2.54 | 5 | PMA-ST |
| | 37 | DPHA | 60 | B-1 | 2 | SMA-3000P | 3:1 | 2.54 | 5 | PMA-ST |
| | 38 | DPHA | 60 | B-1 | 2 | SMA-3000P | 3:1 | 2.54 | 5 | PMA-ST |
| | 39 | DPHA | 60 | B-1 | 2 | SMA-3000P | 3:1 | 2.54 | 0.1 | PMA-ST |
| | 40 | DPHA | 60 | B-1 | 2 | SMA-3000P | 3:1 | 2.54 | 10 | PMA-ST |
| | 41 | DPHA | 60 | B-1 | 2 | SMA-3000P | 3:1 | 2.54 | 5 | PGM-ST |
| | 42 | DPHA | 60 | B-1 | 2 | SMA-3000P | 3:1 | 2.54 | 5 | PGM-ST |
| | 43 | DPHA | 20 | B-1 | 2 | SMA-3000P | 3:1 | 2.54 | 5 | PGM-ST |
| | 44 | DPHA | 120 | B-1 | 2 | SMA-3000P | 3:1 | 2.54 | 5 | PMA-ST |
| Comparative Examples | 1 | DPHA | 60 | B-1 | 2 | SMA-1000P | 1:1 | 4.55 | 5 | PMA-ST |
| | 2 | DPHA | 60 | B-1 | 2 | SMA-2000P | 2:1 | 3.06 | 5 | PMA-ST |
| | 3 | DPHA | 60 | B-1 | 2 | SMA EF-80 | 8:1 | 1.17 | 5 | PMA-ST |
| | 4 | DPHA | 60 | B-1 | 2 | SMA-2625 | 2:1 | 0.94 | 5 | PMA-ST |
| | 5 | DPHA | 60 | B-1 | 2 | SMA-17352 | 1:1 | 1.21 | 5 | PMA-ST |
| | 6 | DPHA | 60 | B-1 | 2 | Polystylene | — | 0 | 5 | PMA-ST |
| | 7 | DPHA | 60 | B-1 | 2 | — | — | — | — | PMA-ST |
| | 8 | DPHA | 60 | B-1 | 2 | SMA-3000P | 3:1 | 2.54 | 5 | — |
| | 9 | M-5300 | 60 | B-1 | 2 | SMA-3000P | 3:1 | 2.54 | 5 | PMA-ST |
| | 10 | DPHA | 60 | B-1 | 2 | SMA-3000P | 3:1 | 2.54 | 5 | E-6 |

| | | Particles | | Polymerization inhibitor | | Alkoxysilane compound | | Surfactant | |
|---|---|---|---|---|---|---|---|---|---|
| | | Number average primary particle size (nm) | Amount of addition | Kind | Amount of addition | Kind | Amount of addition | Kind | Amount of addition |
| Examples | 28 | 10-15 | 30 | Phenothiazine | 0.2 | KBM-5103 | 10 | W-1 | 0.1 |
| | 29 | 10-15 | 30 | Phenothiazine | 0.2 | KBM-5103 | 10 | W-1 | 0.1 |
| | 30 | 10-15 | 30 | Phenothiazine | 0.2 | KBM-5103 | 10 | W-1 | 0.1 |
| | 31 | 10-15 | 30 | Phenothiazine | 0.2 | KBM-5103 | 10 | W-1 | 0.1 |
| | 32 | 10-15 | 30 | Phenothiazine | 0.2 | KBM-5103 | 10 | W-1 | 0.1 |
| | 33 | 10-15 | 30 | Phenothiazine | 0.1 | KBM-5103 | 10 | W-1 | 0.1 |
| | 34 | 10-15 | 30 | Phenoxazine | 0.2 | KBM-5103 | 10 | W-1 | 0.1 |
| | 35 | 10-15 | 30 | Phenothiazine | 0.2 | KBM-5103 | 15 | W-1 | 0.1 |
| | 36 | 10-15 | 30 | Phenothiazine | 0.2 | KBM-403 | 10 | W-1 | 0.1 |
| | 37 | 10-15 | 30 | Phenothiazine | 0.2 | KBM-5103 | 10 | W-1 | 0.2 |
| | 38 | 10-15 | 30 | Phenothiazine | 0.2 | KBM-5103 | 10 | W-2 | 0.1 |
| | 39 | 10-15 | 30 | Phenothiazine | 0.2 | KBM-5103 | 10 | W-1 | 0.1 |
| | 40 | 10-15 | 30 | Phenothiazine | 0.2 | KBM-5103 | 10 | W-1 | 0.1 |
| | 41 | 10-15 | 5 | Phenothiazine | 0.2 | KBM-5103 | 10 | W-1 | 0.1 |
| | 42 | 10-15 | 55 | Phenothiazine | 0.2 | KBM-5103 | 10 | W-1 | 0.1 |

TABLE 2-continued

|  |  |  |  |  |  |  |  |  |  |  |
|---|---|---|---|---|---|---|---|---|---|---|
|  | 43 | 10-15 | 30 | Phenothiazine | 0.2 | KBM-5103 | 10 | W-1 | 0.1 |
|  | 44 | 10-15 | 30 | Phenothiazine | 0.2 | KBM-5103 | 10 | W-1 | 0.1 |
| Comparative | 1 | 10-15 | 30 | Phenothiazine | 0.2 | KBM-5103 | 10 | W-1 | 0.1 |
| Examples | 2 | 10-15 | 30 | Phenothiazine | 0.2 | KBM-5103 | 10 | W-1 | 0.1 |
|  | 3 | 10-15 | 30 | Phenothiazine | 0.2 | KBM-5103 | 10 | W-1 | 0.1 |
|  | 4 | 10-15 | 30 | Phenothiazine | 0.2 | KBM-5103 | 10 | W-1 | 0.1 |
|  | 5 | 10-15 | 30 | Phenothiazine | 0.2 | KBM-5103 | 10 | W-1 | 0.1 |
|  | 6 | 10-15 | 30 | Phenothiazine | 0.2 | KBM-5103 | 10 | W-1 | 0.1 |
|  | 7 | 10-15 | 30 | Phenothiazine | 0.2 | KBM-5103 | 10 | W-1 | 0.1 |
|  | 8 | — | — | Phenothiazine | 0.2 | KBM-5103 | 10 | W-1 | 0.1 |
|  | 9 | 10-15 | 30 | Phenothiazine | 0.2 | KBM-5103 | 10 | W-1 | 0.1 |
|  | 10 | 300 | 30 | Phenothiazine | 0.2 | KBM-5103 | 10 | W-1 | 0.1 |

TABLE 3

| | Acid value in photosensitive composition (mgK (OH/g)) | Perspiration resistance | Footing | Pencil hardness | Transmittance |
|---|---|---|---|---|---|
| Example 1 | <1.0 | 4 | 4 | 6H | 5 |
| Example 2 | <1.0 | 5 | 4 | 6H | 5 |
| Example 3 | <1.0 | 5 | 4 | 6H | 5 |
| Example 4 | <1.0 | 5 | 4 | 6H | 5 |
| Example 5 | <1.0 | 4 | 4 | 6H | 5 |
| Example 6 | <1.0 | 4 | 4 | 6H | 5 |
| Example 7 | <1.0 | 4 | 4 | 6H | 5 |
| Example 8 | <1.0 | 3 | 4 | 6H | 5 |
| Example 9 | <1.0 | 4 | 4 | 6H | 5 |
| Example 10 | <1.0 | 5 | 3 | 6H | 5 |
| Example 11 | <1.0 | 5 | 4 | 6H | 4 |
| Example 12 | <1.0 | 5 | 4 | 6H | 5 |
| Example 13 | <1.0 | 5 | 4 | 6H | 3 |
| Example 14 | <1.0 | 5 | 4 | 6H | 4 |
| Example 15 | <1.0 | 5 | 5 | 4H | 5 |
| Example 16 | <1.0 | 5 | 4 | 5H | 5 |
| Example 17 | <1.0 | 4 | 4 | 6H | 5 |
| Example 18 | <1.0 | 3 | 4 | 6H | 5 |
| Example 19 | <1.0 | 4 | 4 | 6H | 4 |
| Example 20 | <1.0 | 4 | 4 | 6H | 5 |
| Example 21 | <1.0 | 4 | 4 | 6H | 5 |
| Example 22 | <1.0 | 4 | 4 | 6H | 5 |
| Example 23 | <1.0 | 4 | 4 | 6H | 5 |
| Example 24 | 55 | 3 | 4 | 6H | 5 |
| Example 25 | 20 | 3 | 4 | 6H | 5 |
| Example 26 | <1.0 | 3 | 4 | 4H | 5 |
| Example 27 | <1.0 | 4 | 4 | 6H | 5 |
| Example 28 | <1.0 | 4 | 4 | 6H | 5 |
| Example 29 | <1.0 | 4 | 3 | 6H | 5 |
| Example 30 | <1.0 | 4 | 4 | 6H | 5 |
| Example 31 | <1.0 | 4 | 4 | 6H | 5 |
| Example 32 | <1.0 | 4 | 5 | 5H | 5 |
| Example 33 | <1.0 | 4 | 4 | 6H | 5 |
| Example 34 | <1.0 | 4 | 4 | 6H | 5 |
| Example 35 | <1.0 | 4 | 4 | 6H | 5 |
| Example 36 | <1.0 | 4 | 4 | 6H | 5 |
| Example 37 | <1.0 | 4 | 4 | 6H | 5 |
| Example 38 | <1.0 | 4 | 4 | 6H | 5 |
| Example 39 | <1.0 | 3 | 3 | 6H | 5 |
| Example 40 | <1.0 | 5 | 3 | 6H | 5 |
| Example 41 | <1.0 | 5 | 3 | 4H | 5 |
| Example 42 | <1.0 | 3 | 3 | 6H | 3 |
| Example 43 | <1.0 | 4 | 3 | 5H | 5 |
| Example 44 | <1.0 | 4 | 4 | 4H | 5 |
| Comparative Example 1 | <1.0 | 1 | 5 | 6H | 5 |
| Comparative Example 2 | <1.0 | 2 | 5 | 6H | 5 |
| Comparative Example 3 | <1.0 | 5 | 1 | 6H | 5 |
| Comparative Example 4 | <1.0 | 1 | 5 | 6H | 5 |
| Comparative Example 5 | <1.0 | 1 | 5 | 6H | 5 |
| Comparative Example 6 | <1.0 | 5 | 1 | 6H | 5 |
| Comparative Example 7 | <1.0 | 2 | 2 | 6H | 5 |
| Comparative Example 8 | <1.0 | 5 | 3 | 1H | 5 |
| Comparative Example 9 | 110 | 3 | 4 | 3H | 5 |
| Comparative Example 10 | <1.0 | 3 | 4 | 6H | 1 |

<Production of Display Device>

In a display device shown in FIG. 4, the photosensitive composition obtained in each of Examples of the present disclosure was used for a touch sensing electrode protective film (insulating film, 420), thus producing a display device. Specifically, the protective film (420) was formed by applying the photosensitive composition obtained in each of Examples by slit coating, prebaking the photosensitive composition at 90° C. for 120 seconds, carrying out light irradiation of 500 mJ/cm$^2$ (in terms of i-line) by a high-pressure mercury lamp, and carrying out a bake at 120° C. for 60 minutes in an oven. The other portion of the display device was produced in accordance with a manufacturing method described as FIG. 19 in JP-A No. 2013-168125. The produced display device had both excellent display performance and excellent touch detection performance.

<Manufacture of Touch Panel>

The following resist composition was applied on a polyethylene terephthalate (PET) substrate (100 mm×100 mm) having a copper film formed so as to have a thickness of 200 nm, exposed, and developed, thus patterning a resist layer. Herein, the pattern of the resist layer was formed so as to have a pattern corresponding to a touch sensor portion in a mesh form, a wiring portion for footing having a width of from 0.02 to 0.05 mm, and a connection terminal. Then, etching was carried out by a copper etchant (CleanEtch SE-07, manufactured by Ryoko Chemical Co., Ltd., product diluted 7-fold), and a resist was then removed, thus producing a substrate including a copper wiring layer. The wiring layer has a pattern part corresponding to a touch sensor part having a copper wiring pattern having a line width of 5 μm, a wiring film thickness of 200 nm, and a wiring pitch of 1:600, a wiring part for footing, and a connection terminal.

A first touch panel member was formed by applying the photosensitive composition obtained in each of Examples to the substrate by slit coating, prebaking the photosensitive composition at 90° C. for 120 seconds, carrying out light irradiation of 500 mJ/cm$^2$ (in terms of i-line) by a high-pressure mercury lamp, and carrying out a bake at 120° C. for 60 minutes in an oven. By the same method as the above, a second touch panel member was formed, and the first and second touch panel members were laminated together. The pattern part corresponding to the connection terminal in the above first and second touch panel members was connected to a driving IC (integrated circuit) by a flexible printed circuit board (FPC), thus manufacturing a touch panel.

In the above touch panel, change in electrostatic capacity generated in the case of touch operation was measured, and the presence or absence of the touch operation was confirmed. In the case of the touch operation, it was tested whether a touch position could be detected.

Also in the above touch panel, the performance without incident was confirmed.

<Resist Composition>

The following components were solution-mixed, and filtered with a polytetrafluoroethylene filter having a pore diameter of 0.2 μm, thus giving a resist composition.

PHS-EVE (1-ethoxyethyl protection product of p-hydroxystyrene/p-hydroxystyrene copolymer (30 mol %/70 mol %), the following structure): 71.4 parts The following acrylic polymer: 28.6 parts IRGACURE PAG 103 (manufactured by BASF): 2.7 parts Dibutoxy anthracene: 2.7 parts Epoxy resin (JER157S65, manufactured by Japan Epoxy Resin): 2.7 parts Solvent PGMEA (propylene glycol monomethyl ether acetate): A non-volatile content was adjusted to 10 mass % based on the entire composition.

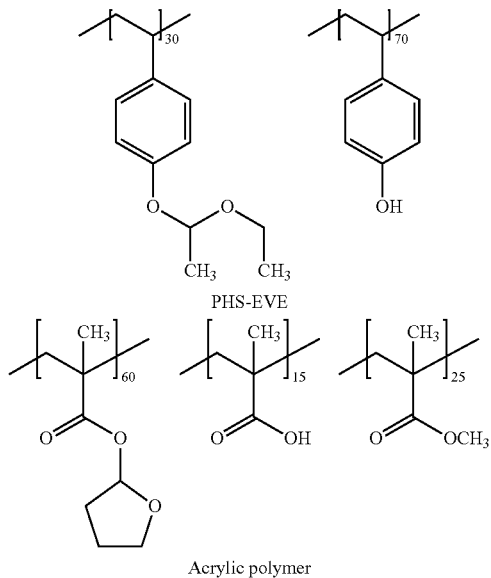

Acrylic polymer

The number on the right lower side in the parenthesis in each of the constitutional units of the above acrylic polymer represents a molar ratio.

The disclosure of Japanese Patent Application No. 2015-233626 filed on Nov. 30, 2015 is hereby incorporated by reference in its entirety.

All the references, patent applications, and technical standards that are described in the present specification are hereby incorporated by reference to the same extent as if each individual reference, patent application, and technical standard are specifically and individually described to be incorporated by reference.

What is claimed is:

1. A photosensitive composition comprising:
   a compound having two or more ethylenically unsaturated groups;
   a photopolymerization initiator;
   a polymer A1 containing a constitutional unit a1 represented by the following Formula 1 and a constitutional unit a2 having a carboxylic acid anhydride structure;
   particles; and
   a solvent,
   wherein:
   a molar content ratio of the constitutional unit a1 to the constitutional unit a2, a1:a2, in the polymer A1 is in a range of from 3:1 to 6:1;
   an acid anhydride value of the polymer A1 is from 1.30 to 3.00 mmol/g; and
   a number average primary particle size of the particles is from 10 to 200 nm,

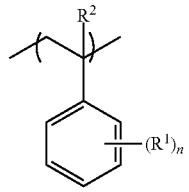

Formula 1 wherein, in Formula 1, each $R^1$ independently represents a hydroxyl group, an alkyl group, an aryl group, an alkoxy group, a carboxy group, or a halogen atom; $R^2$ represents a hydrogen atom, an alkyl group, or an aryl group; and n represents an integer from 0 to 5.

2. The photosensitive composition according to claim 1, wherein a content of the polymer A1 is from 0.5 to 8 mass % based on a total solid content of the photosensitive composition.

3. The photosensitive composition according to claim 1, wherein a content of the particles is from 10 to 40 mass % based on a total solid content of the photosensitive composition.

4. The photosensitive composition according to claim 1, wherein a content of the compound having two or more ethylenically unsaturated groups is from 30 to 70 mass % based on a total solid content of the photosensitive composition.

5. The photosensitive composition according to claim 1, further comprising a polymerization inhibitor.

6. The photosensitive composition according to claim 1, wherein an acid value of the photosensitive composition based on a total solid content is 100 mgKOH/g or less.

7. The photosensitive composition according to claim 1, wherein the constitutional unit a2 is a constitutional unit containing a five-member cyclic carboxylic acid anhydride structure.

8. The photosensitive composition according to claim 1, wherein the constitutional unit a2 contains a constitutional unit represented by the following Formula a2-1 and/or a constitutional unit represented by the following Formula a2-2

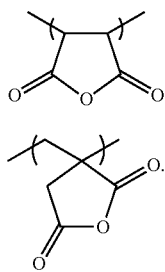

Formula a2-1

Formula a2-2

9. The photosensitive composition according to claim 1, wherein the constitutional unit a2 contains a constitutional unit represented by the following Formula a2-1

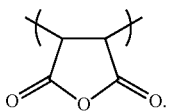

Formula a2-1

10. A method for producing a cured film, the method comprising, in the following order:
   applying the photosensitive composition according to claim 1 on a substrate;
   removing a solvent from the applied photosensitive composition;
   exposing at least a part of the photosensitive composition from which the solvent is removed to actinic radiation; and
   subjecting the photosensitive composition to a heat treatment.

11. A method for producing a cured film, the method comprising, in the following order:
   applying the photosensitive composition according to claim 1 on a substrate;
   removing a solvent from the applied photosensitive composition;
   exposing at least a part of the photosensitive composition from which the solvent is removed to actinic radiation;
   developing the exposed photosensitive composition by an aqueous developing solution; and
   subjecting the developed photosensitive composition to a heat treatment.

12. The method for producing a cured film according to claim 11, wherein a temperature in the heat treatment is from 80 to 150° C.

13. A cured film prepared by curing the photosensitive composition according to claim 1.

14. The cured film according to claim 13, wherein the cured film is an interlayer insulating film or an overcoat film.

15. A touch panel comprising the cured film according to claim 13.

16. A display device comprising the cured film according to claim 13.

17. The cured film according to claim 13, wherein a content of the polymer A1 is from 0.5 to 8 mass % based on a total solid content of the photosensitive composition.

18. The cured film according to claim 13, wherein a content of the compound having two or more ethylenically unsaturated groups is from 30 to 70 mass % based on a total solid content of the photosensitive composition.

19. The cured film according to claim 13, wherein an acid value of the photosensitive composition based on a total solid content is 100 mgKOH/g or less.

20. The cured film according to claim 13, wherein the constitutional unit a2 is a constitutional unit containing a five-member cyclic carboxylic acid anhydride structure.

* * * * *